(12) United States Patent
Kim et al.

(10) Patent No.: US 12,003,254 B2
(45) Date of Patent: Jun. 4, 2024

(54) METHOD AND APPARATUS FOR TRANSMITTING DATA ON BASIS OF POLAR CODING IN WIRELESS COMMUNICATION SYSTEM

(71) Applicant: LG ELECTRONICS INC., Seoul (KR)

(72) Inventors: Bonghoe Kim, Seoul (KR); Kwangseok Noh, Seoul (KR); Ilmin Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 480 days.

(21) Appl. No.: 17/297,705

(22) PCT Filed: Dec. 5, 2019

(86) PCT No.: PCT/KR2019/017092
§ 371 (c)(1),
(2) Date: May 27, 2021

(87) PCT Pub. No.: WO2020/116958
PCT Pub. Date: Jun. 11, 2020

(65) Prior Publication Data
US 2022/0029638 A1 Jan. 27, 2022

(30) Foreign Application Priority Data

Dec. 5, 2018 (KR) .......................... 10-2018-0155495

(51) Int. Cl.
*H03M 13/13* (2006.01)
*H04L 1/00* (2006.01)
(Continued)

(52) U.S. Cl.
CPC .......... *H03M 13/13* (2013.01); *H04L 1/0061* (2013.01); *H04L 1/1812* (2013.01); *H04L 1/1861* (2013.01)

(58) Field of Classification Search
CPC .. H03M 13/13; H03M 13/6306; H03M 13/09; H03M 13/2906; H04L 1/0061;
(Continued)

(56) References Cited

U.S. PATENT DOCUMENTS

2019/0019082 A1* 1/2019 Dasgupta ............... G06N 3/063
2019/0052418 A1* 2/2019 Li ......................... H04L 1/1819
2021/0258988 A1* 8/2021 Balakrishnan ........... G06N 3/08

FOREIGN PATENT DOCUMENTS

KR 1020160115803 A 10/2016
KR 1020170086640 A 7/2017

OTHER PUBLICATIONS

Shao-Yu Lien, "Optimum Ultra-Reliable and Low Latency Communications in 5G New Radio", Mobile Networks and Applications, Springer, 2018, vol. 23, p. 1020-1027, Nov. 2, 2017.
(Continued)

*Primary Examiner* — Charles C Jiang
*Assistant Examiner* — Shawn D Miller
(74) *Attorney, Agent, or Firm* — BRYAN CAVE LEIGHTON PAISNER LLP

(57) ABSTRACT

A method for transmitting data on the basis of polar coding in a wireless communication system, according to the present disclosure may comprise the steps of: transmitting data including a plurality of information blocks, each of which contains a corresponding cyclic redundancy check (CRC); receiving a hybrid automatic repeat request acknowledgement/negative acknowledgement (HARQ ACK/NACK) of the transmitted data; performing learning in order to retransmit the plurality of information blocks; and retransmitting
(Continued)

the plurality of information blocks on the basis of the HARQ ACK/NACK, wherein the step of performing learning comprises the steps of: obtaining current state $s_n$; obtaining actions to be applied to current state $s_n$; and selecting, from the actions, an action maximizing expected reward value $Q_{n+1}$, wherein expected reward value $Q_{n+1}$ is obtained on the basis of rewards $R_1, R_2, \ldots, R_n$ corresponding to states $s_1, s_2, \ldots, s_n$, and the plurality of information blocks is retransmitted on the basis of the selected action.

16 Claims, 26 Drawing Sheets

(51) Int. Cl.
*H04L 1/1812* (2023.01)
*H04L 1/1829* (2023.01)

(58) Field of Classification Search
CPC ....... H04L 1/1812; H04L 1/1861; H04L 1/00; H04L 1/0057
See application file for complete search history.

(56) References Cited

OTHER PUBLICATIONS

Peihong Yuan, "Flexible IR-HARQ scheme for polar-coded modulation", IEEE Wireless Communications and Networking Conference Workshops (WCNCW), IEEE, 2018, p. 49-54, May 31, 2018.
Wen-Ching Chung, "HARQ Control Scheme by Fuzzy Q-Learning for HSPA+", IEEE 73rd Vehicular Technology Conference (VTC Spring), IEEE, Jul. 18, 2011.

* cited by examiner

[FIG. 1A]
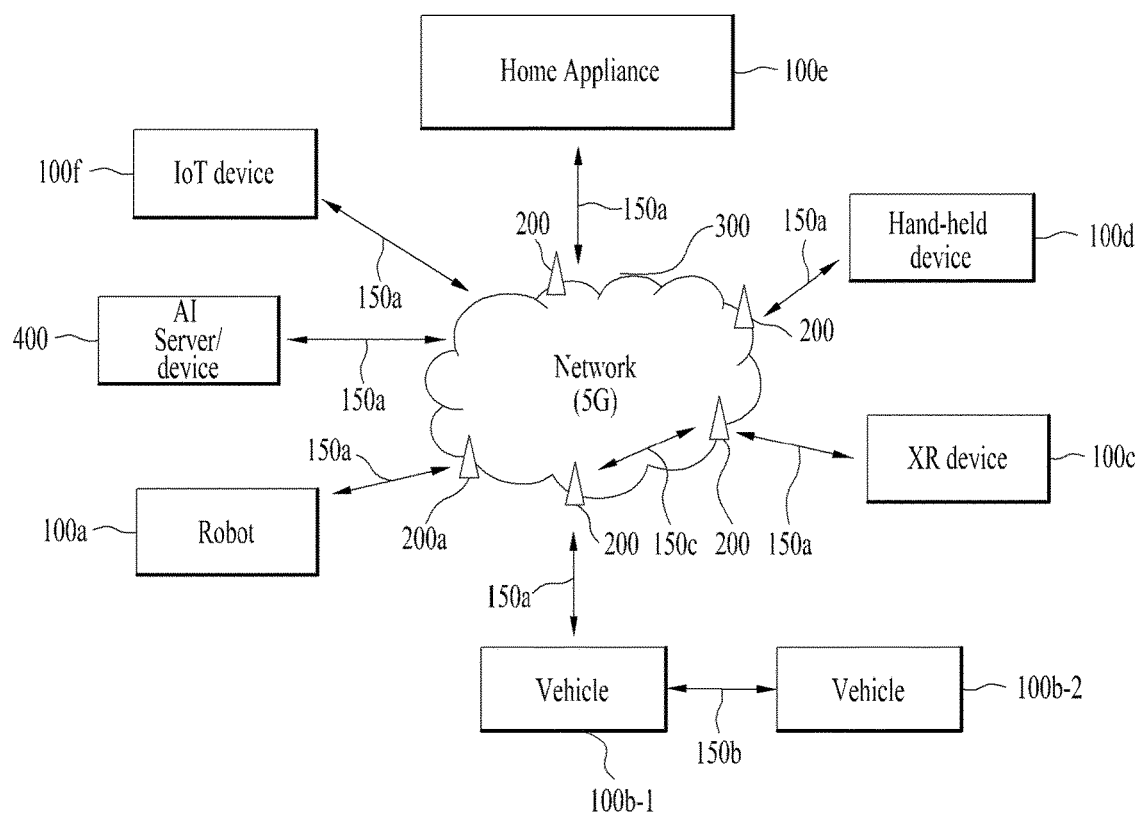

[FIG. 1B]
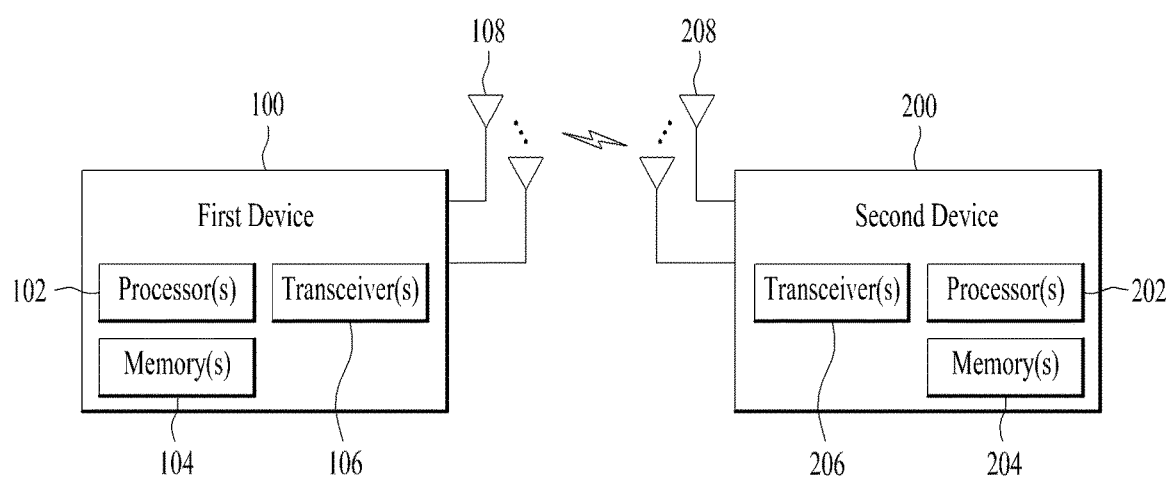

[FIG. 1C]
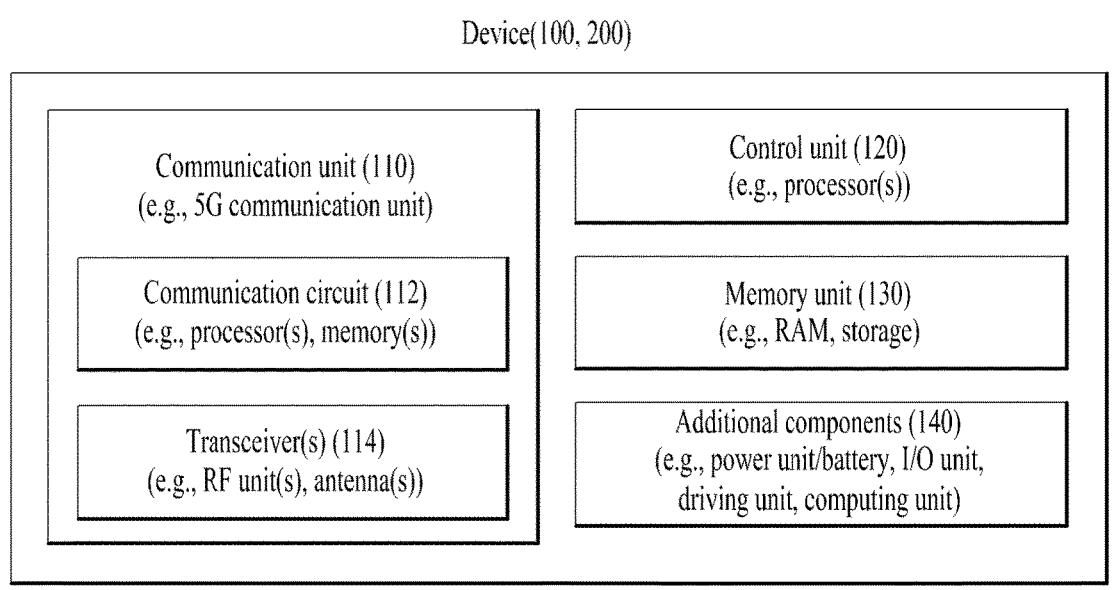

[FIG. 2]
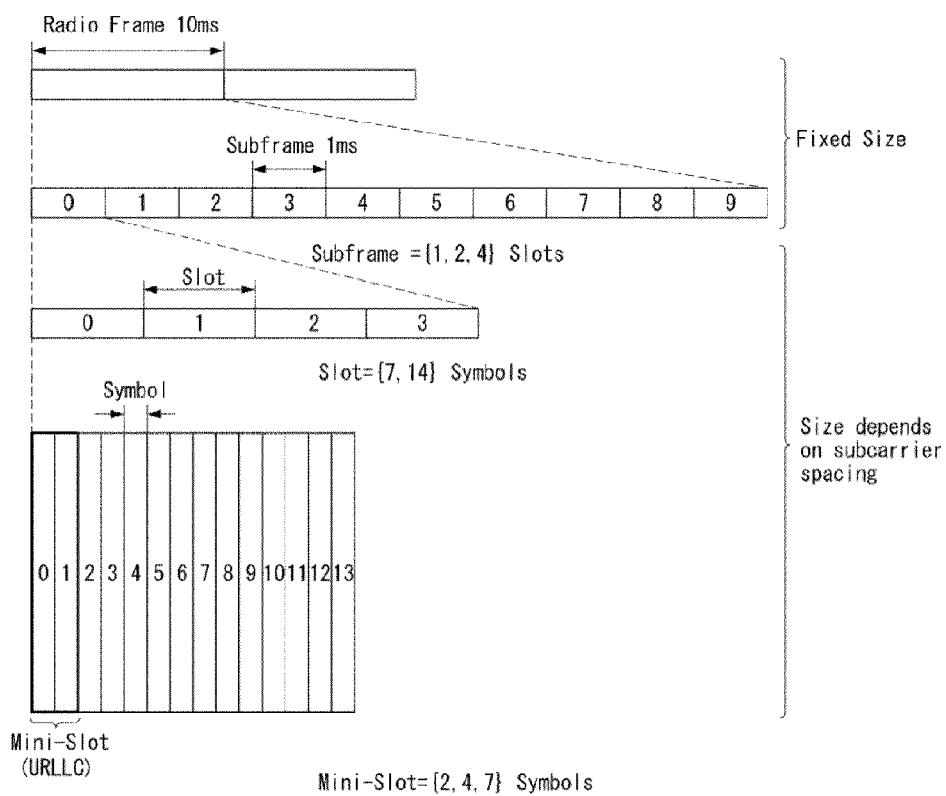

[FIG. 3]
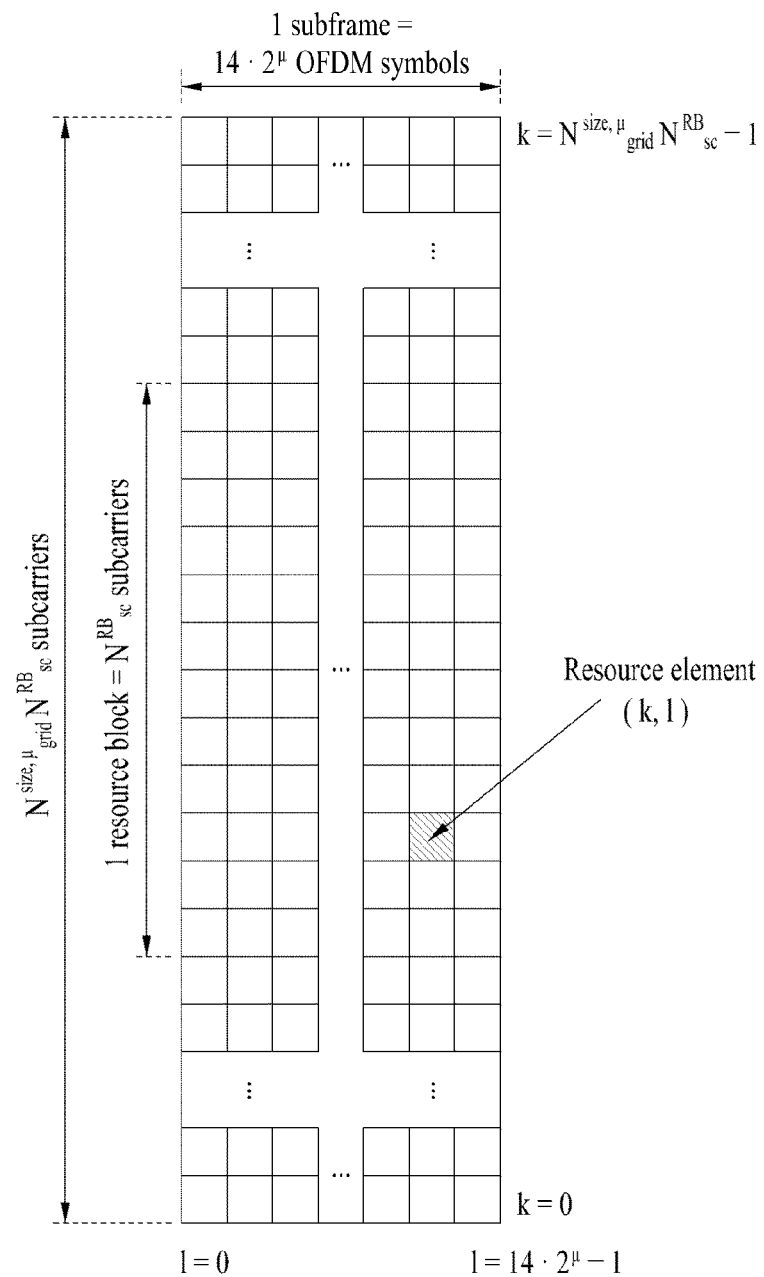

[FIG. 4]
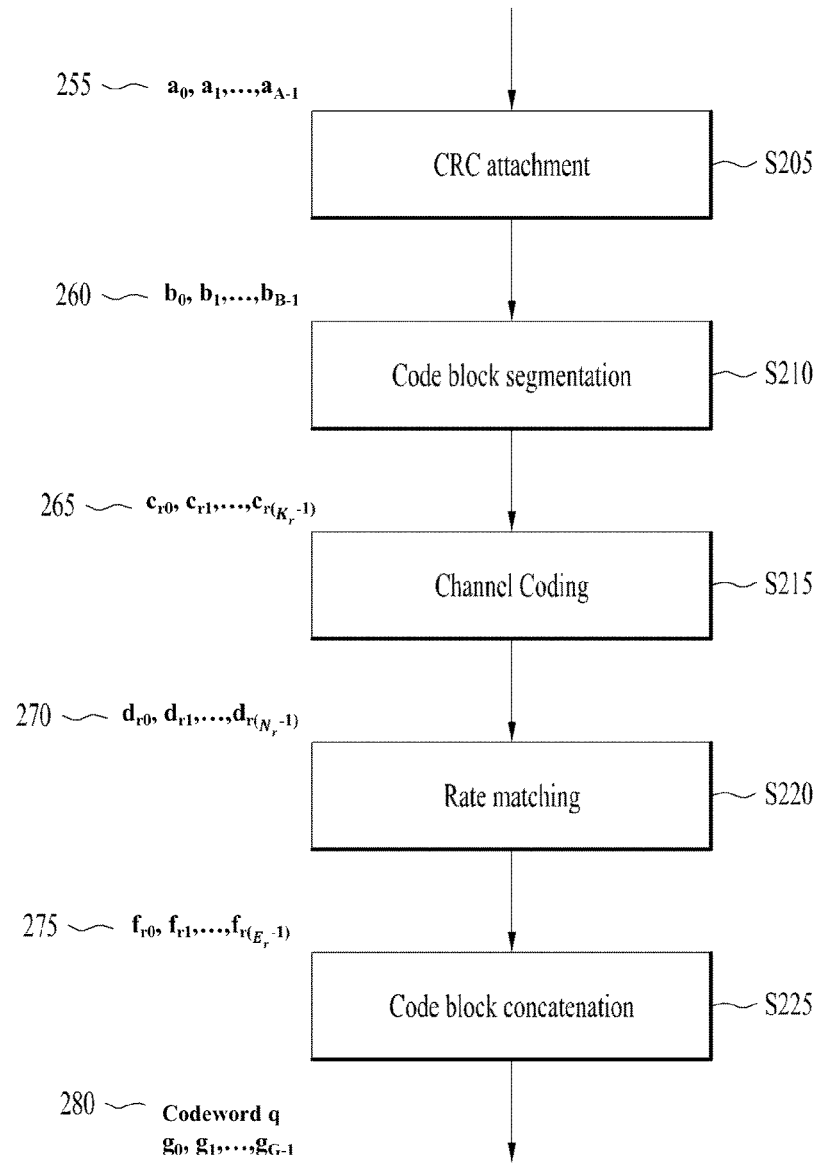

[FIG. 5]
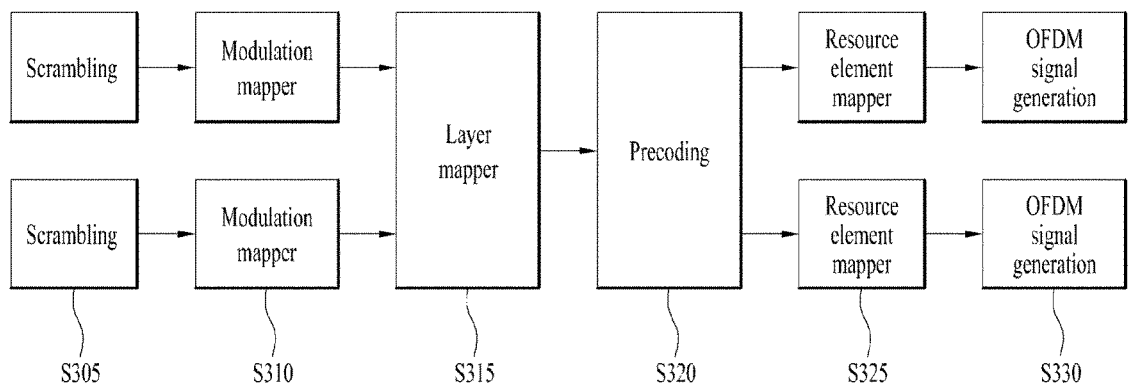

[FIG. 6]
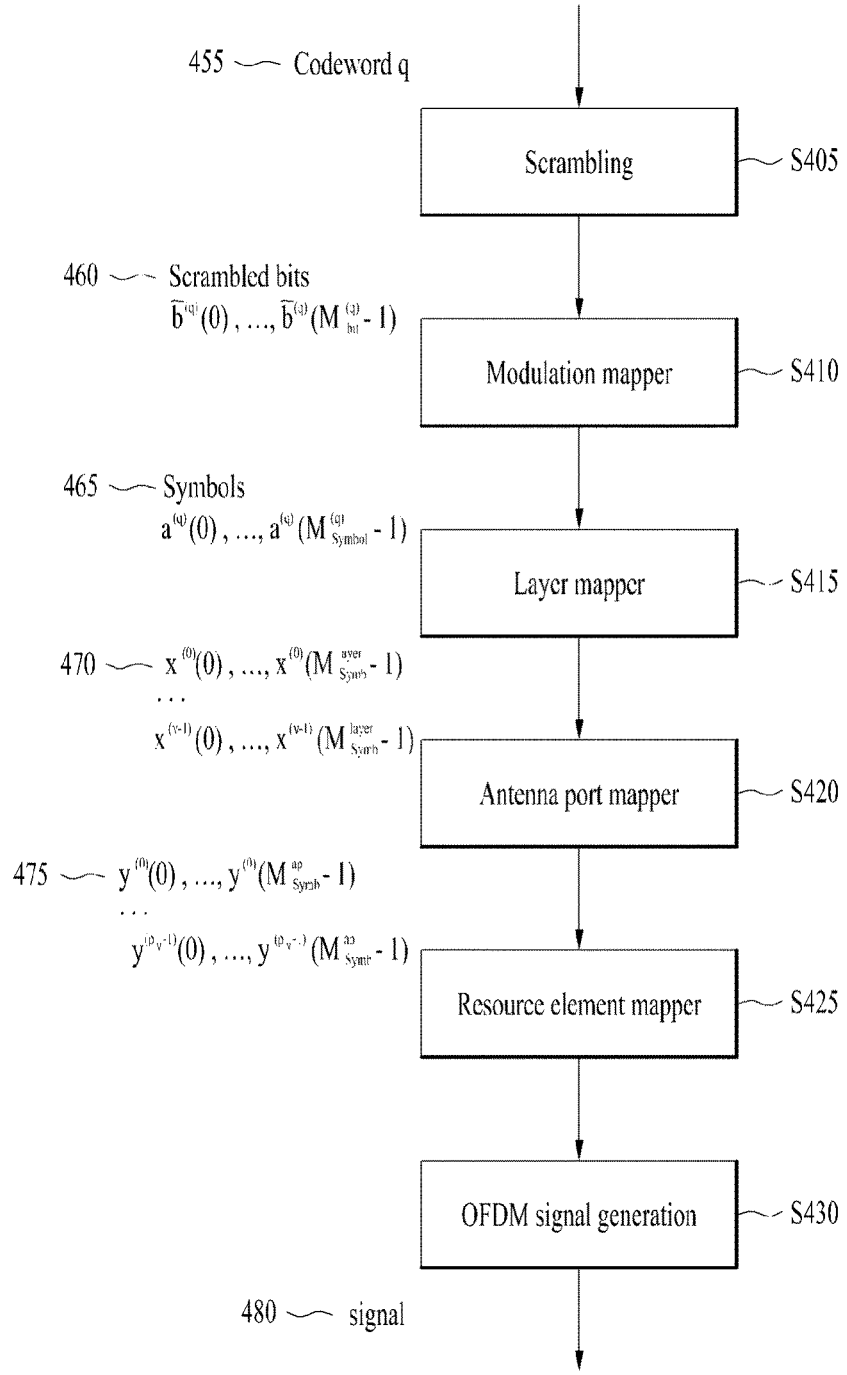

[FIG. 7]
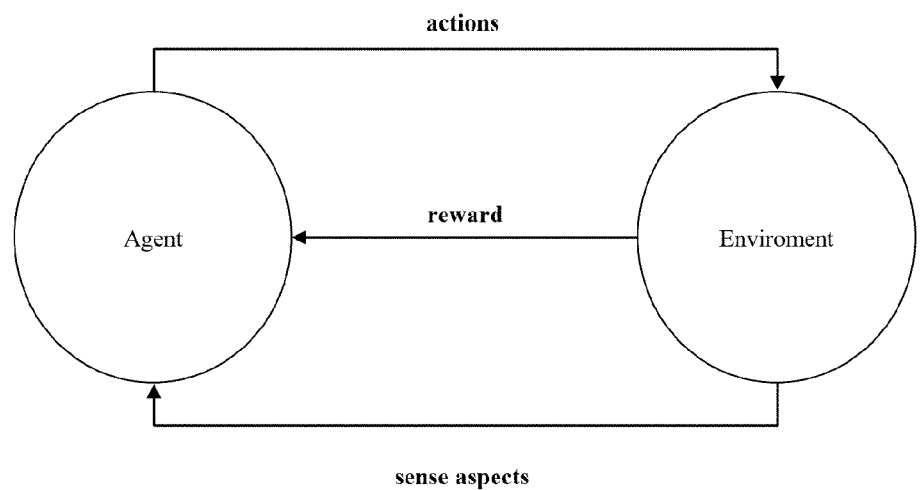

[FIG. 8]
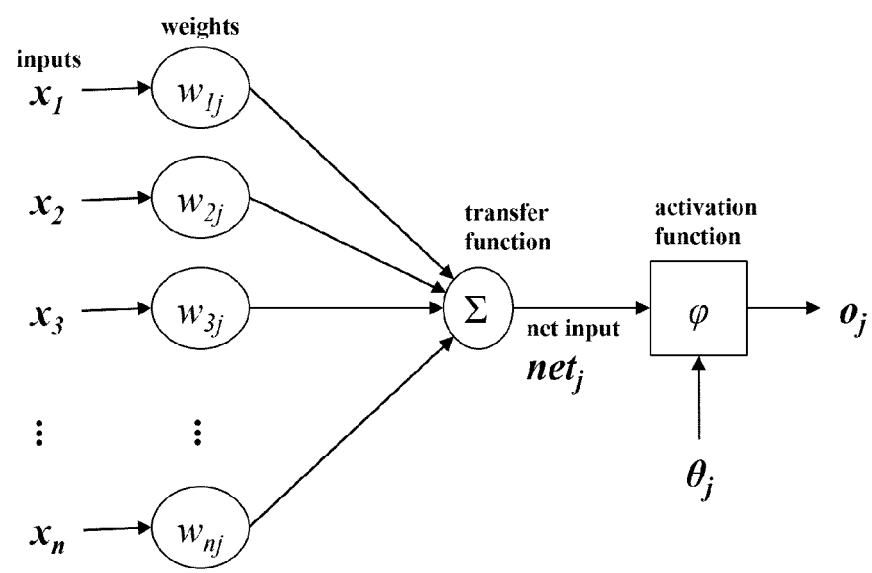

[FIG. 9]
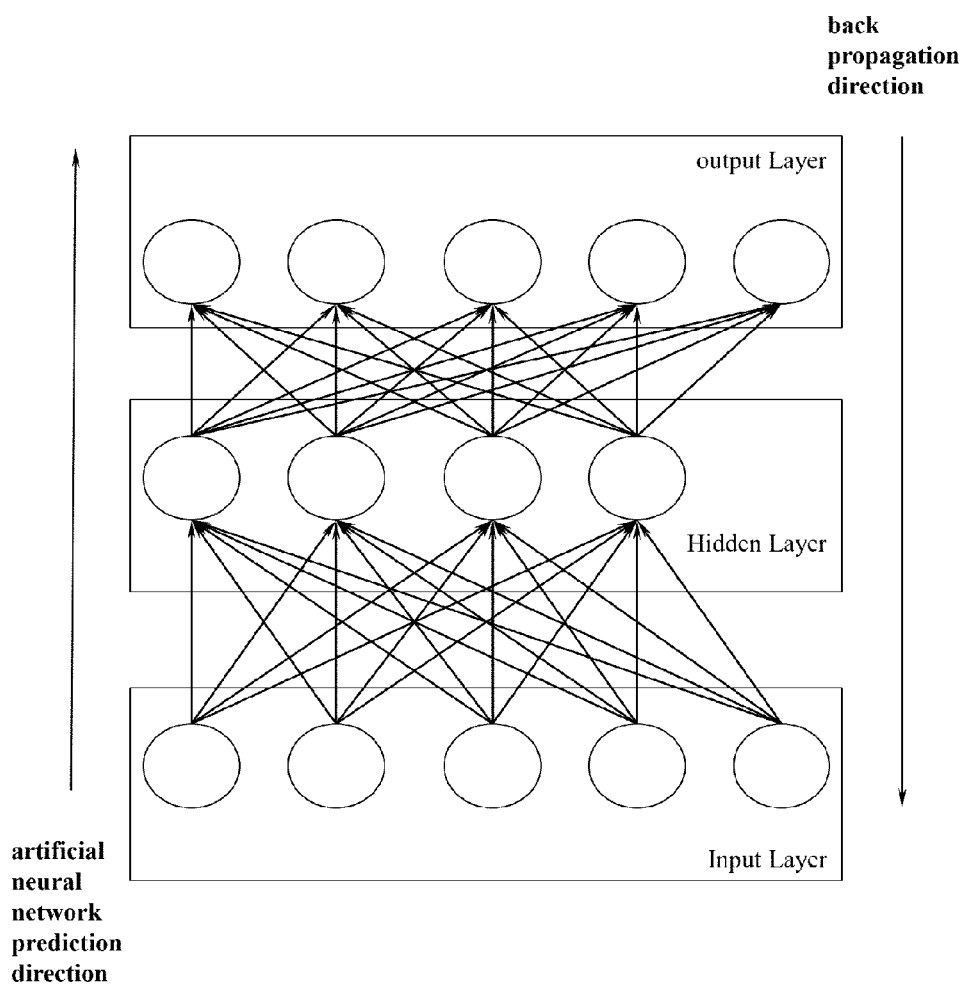

[FIG. 10A]
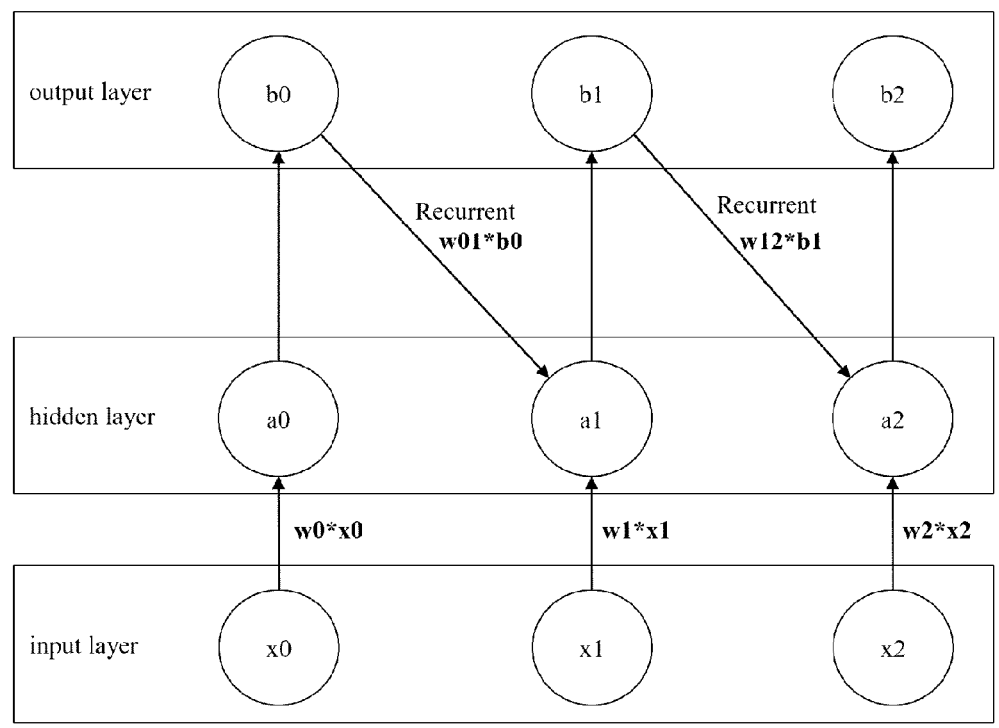

[FIG. 10B]
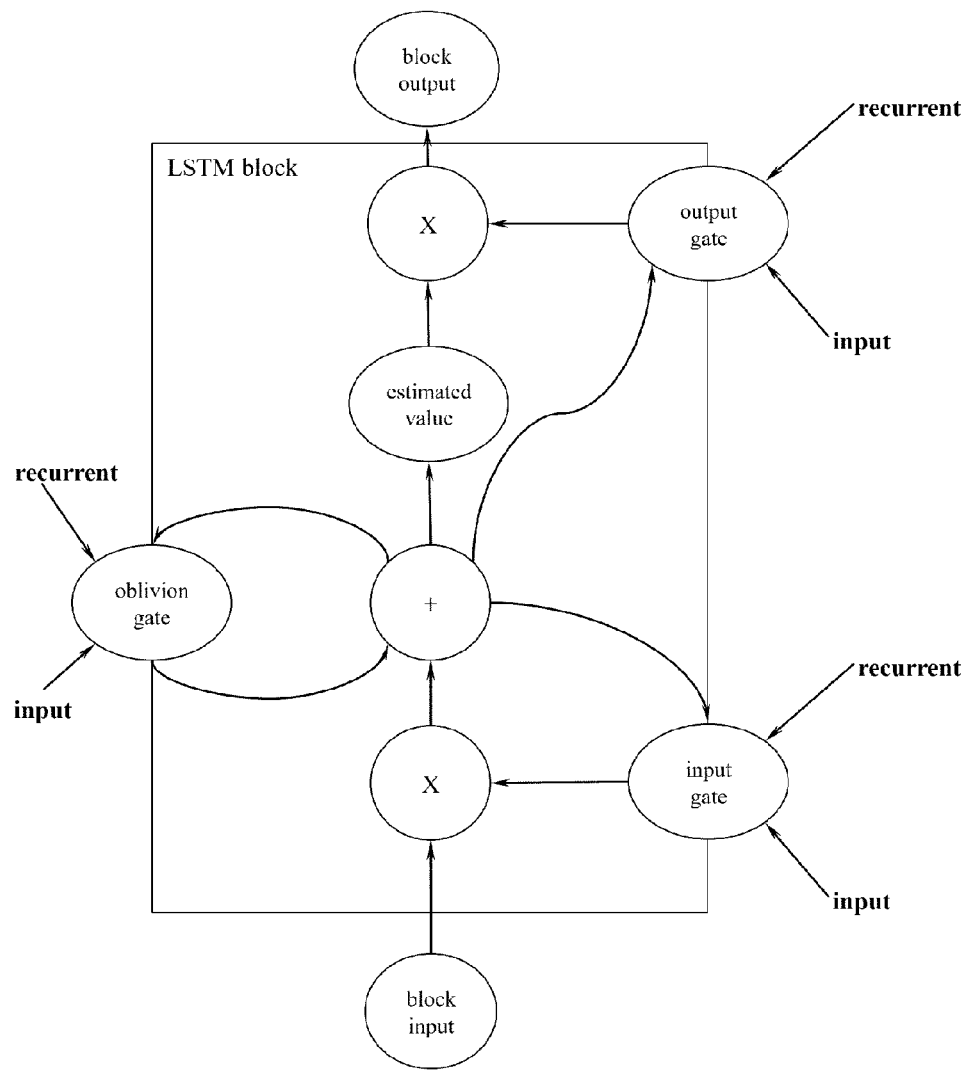

[FIG. 11]
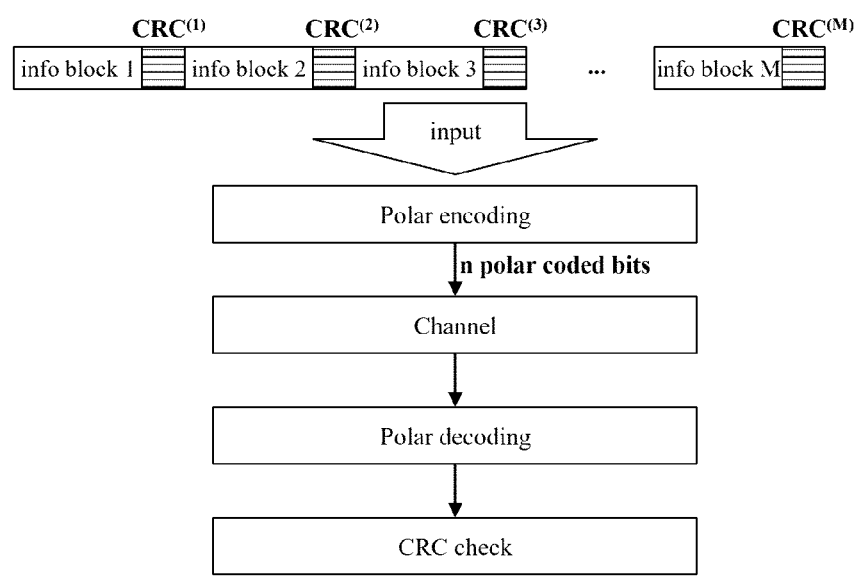

[FIG. 12]
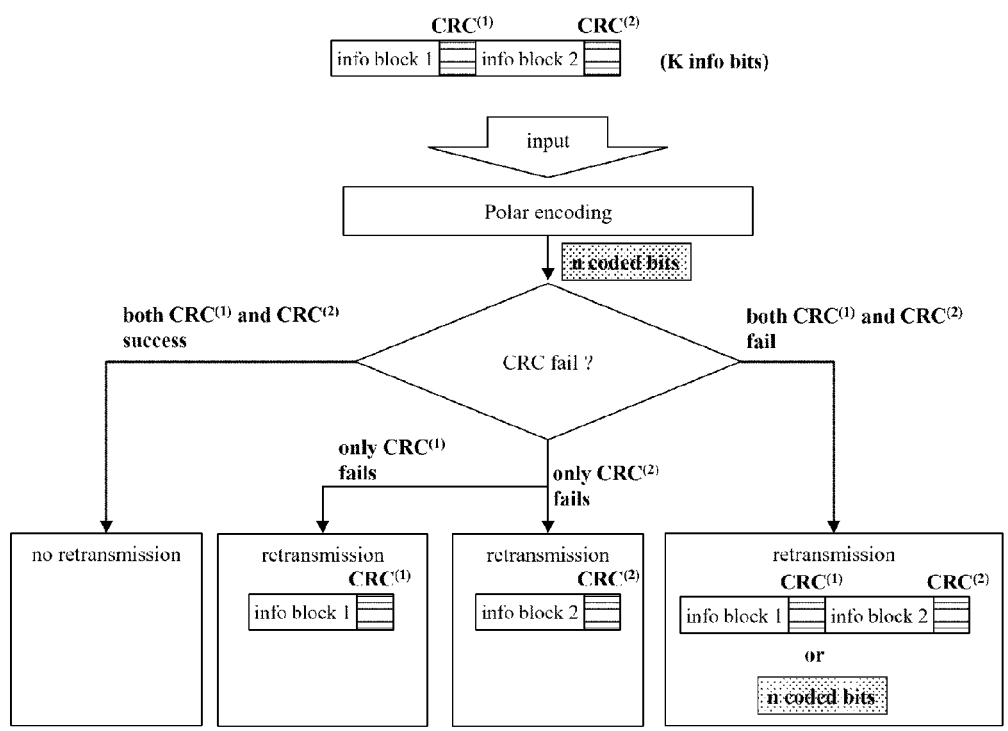

[FIG. 13]
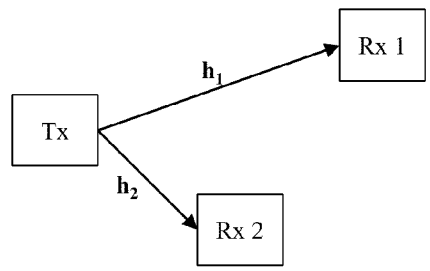
[FIG. 14]
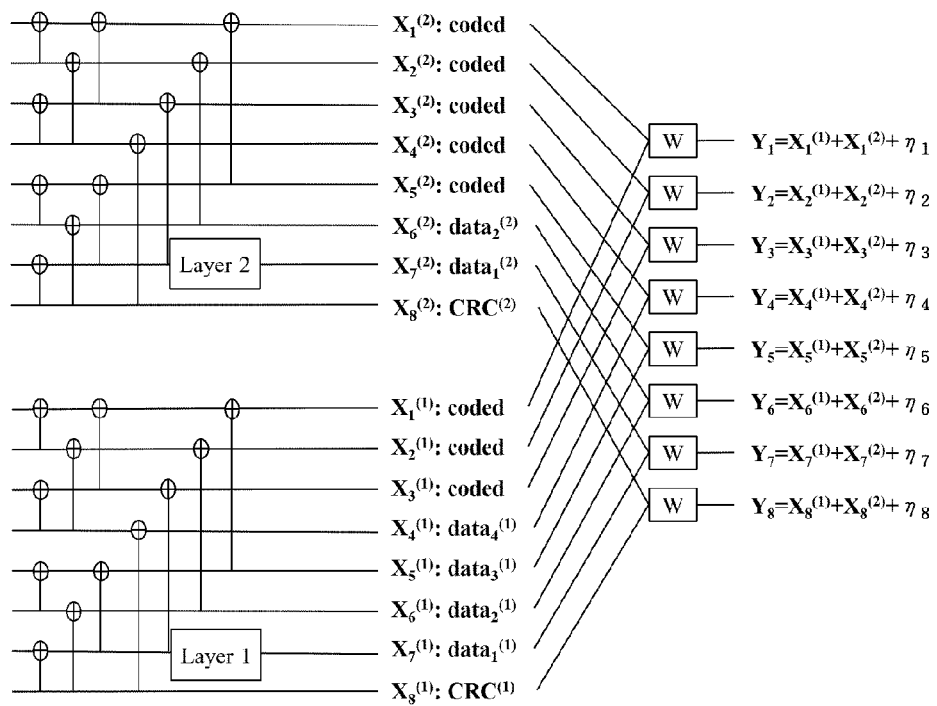

[FIG. 15]
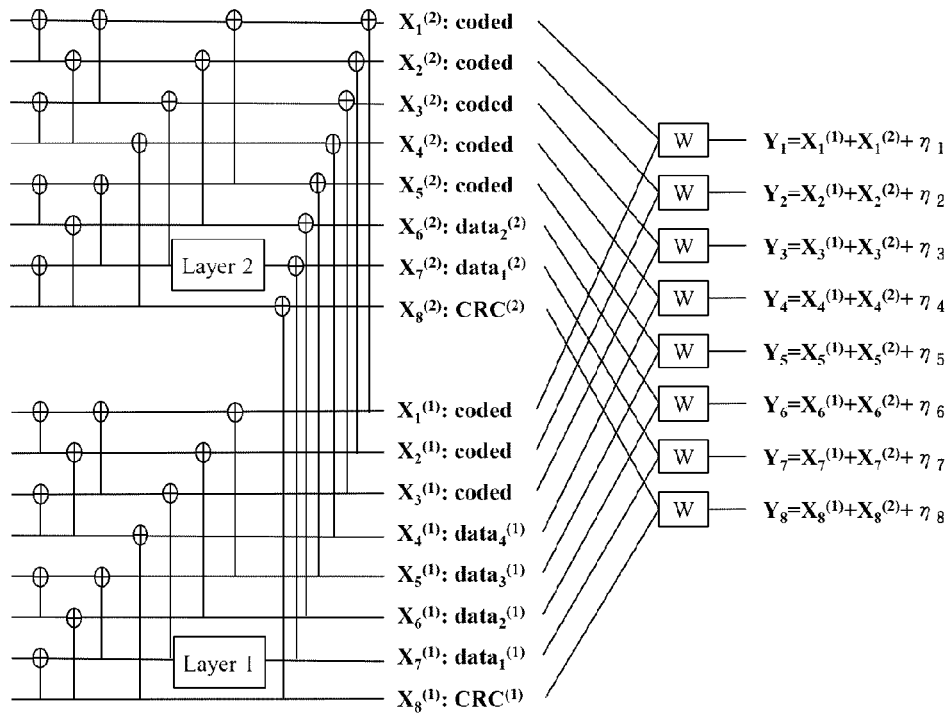
[FIG. 16]
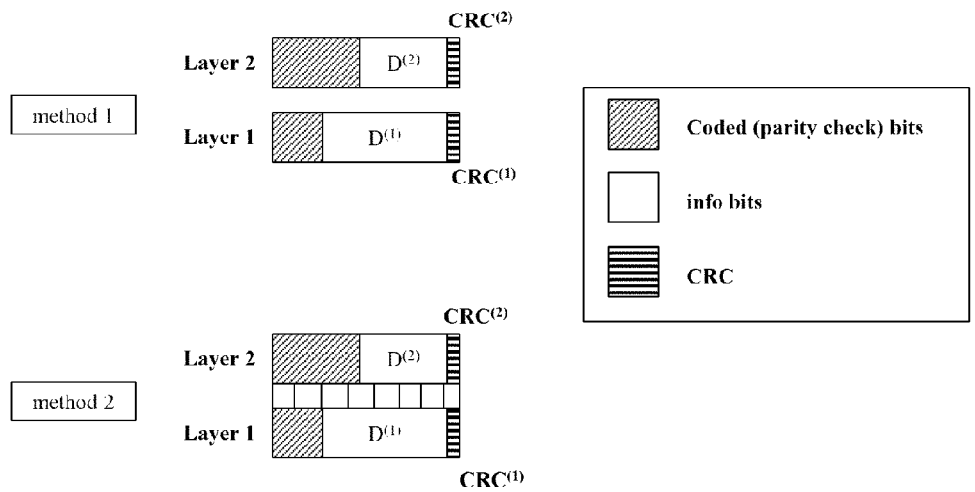

[FIG. 17]
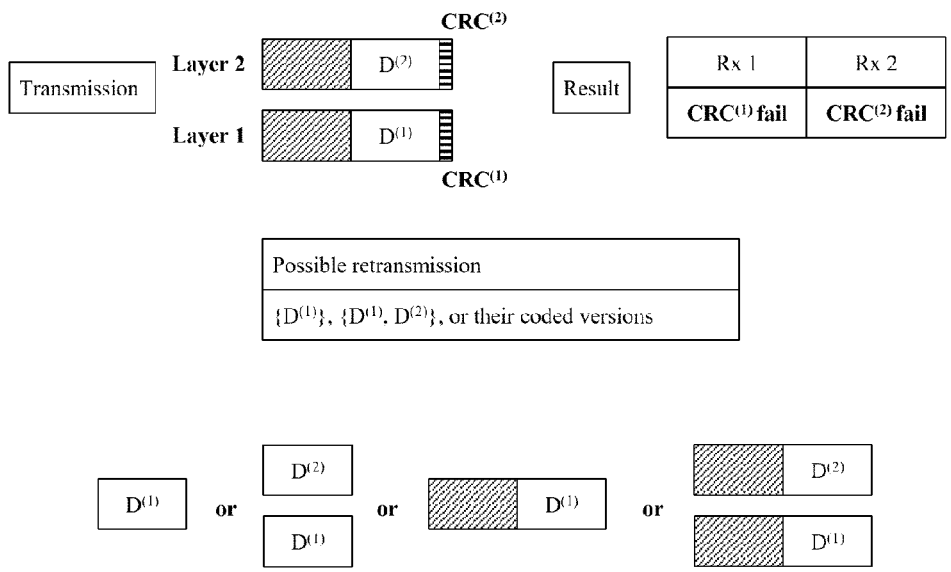
[FIG. 18]
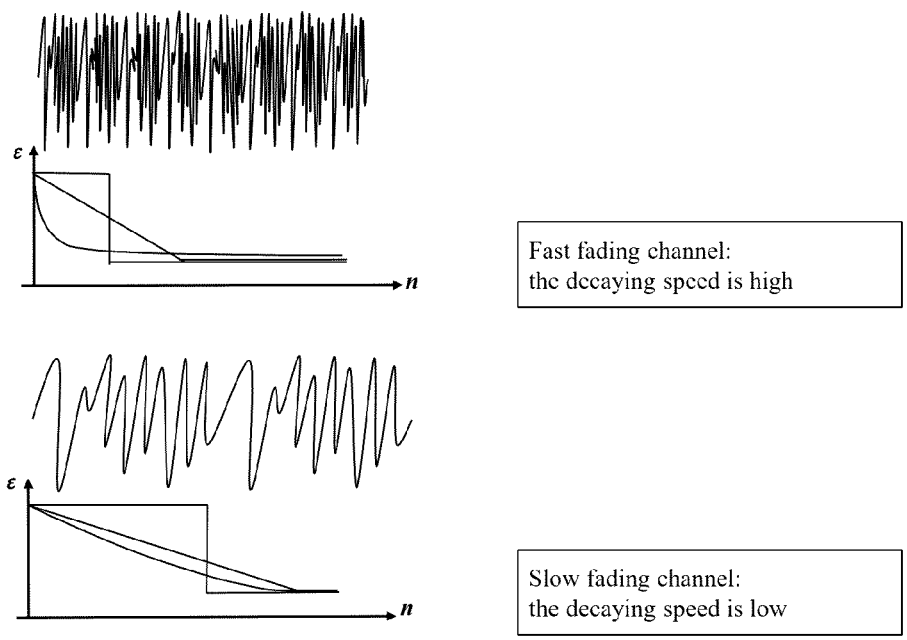

[FIG. 19]
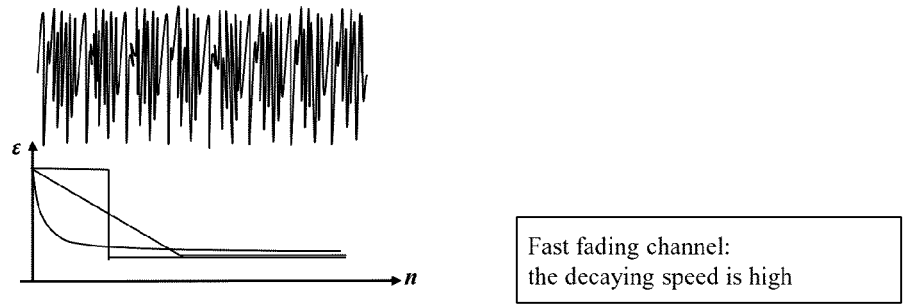
Fast fading channel: the decaying speed is high
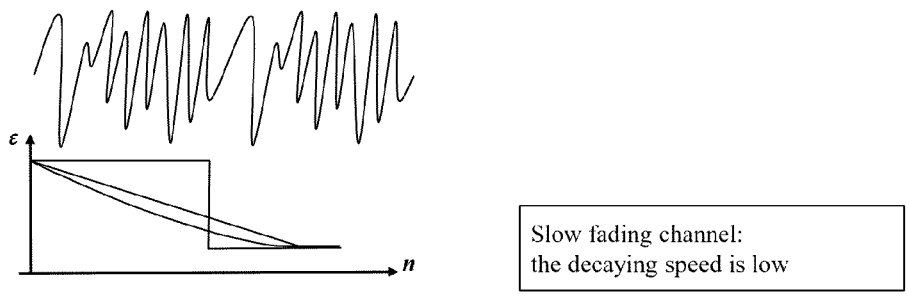
Slow fading channel: the decaying speed is low
[FIG. 20]
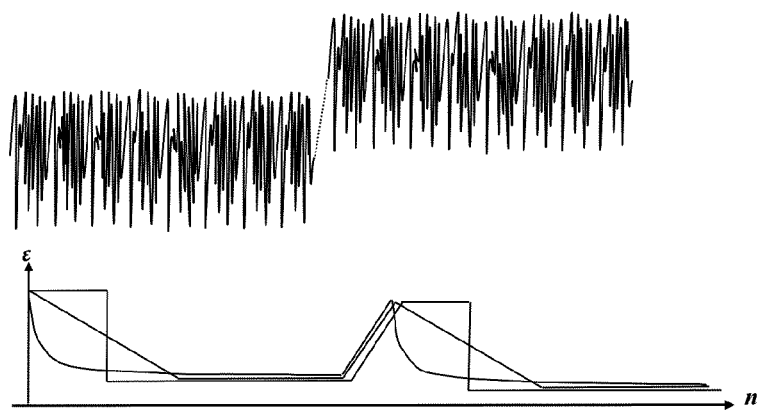
Non-stationary channel:
Whenever the change of channel statistics is greater than a threshold, the value of $\varepsilon$ increases.

[FIG. 21]
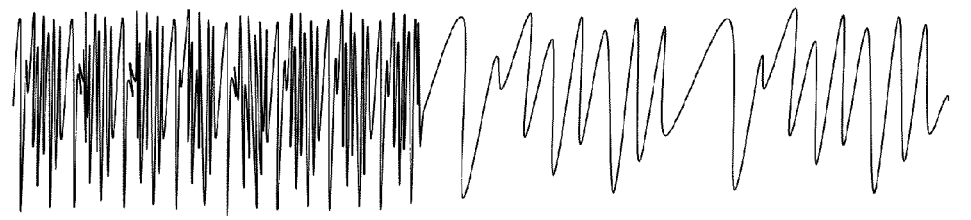
[FIG. 22]
$$\alpha \propto \frac{1}{Var(|h|)}$$
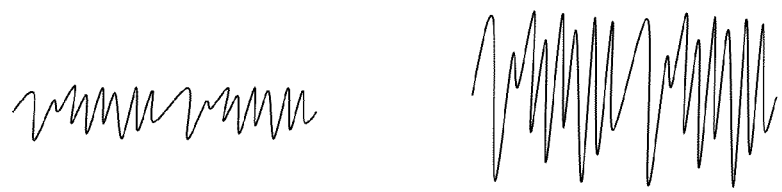
Variance of channel is small ⇒ large $\alpha$
Variance of channel is large ⇒ small $\alpha$

[FIG. 23]
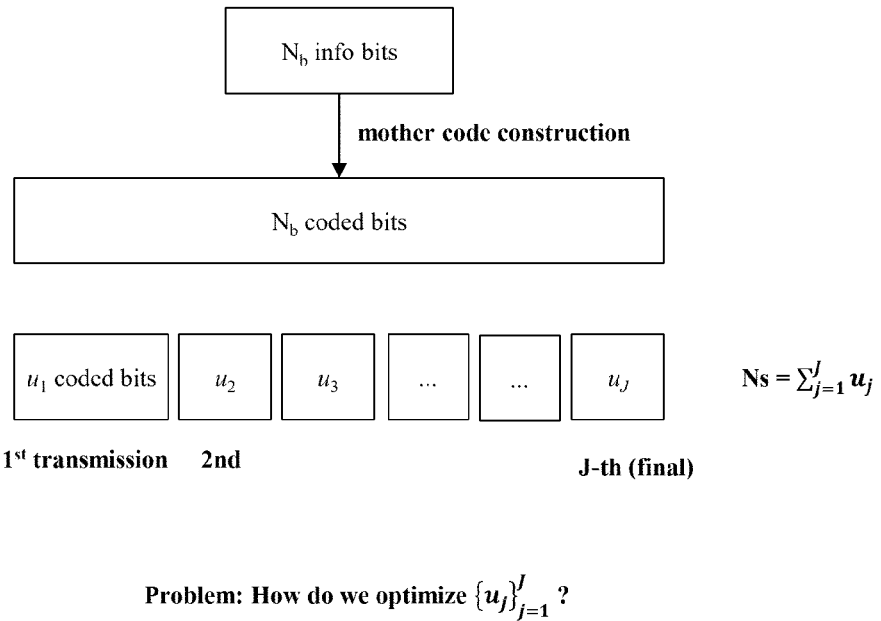
[FIG. 24]
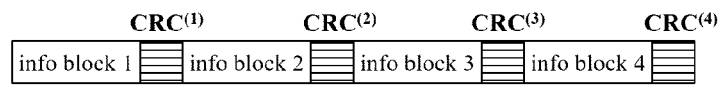
[FIG. 25]
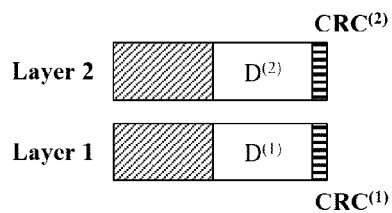

[FIG. 26]
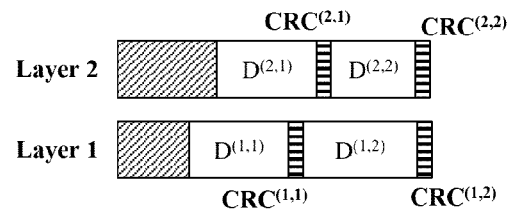
[FIG. 27A]
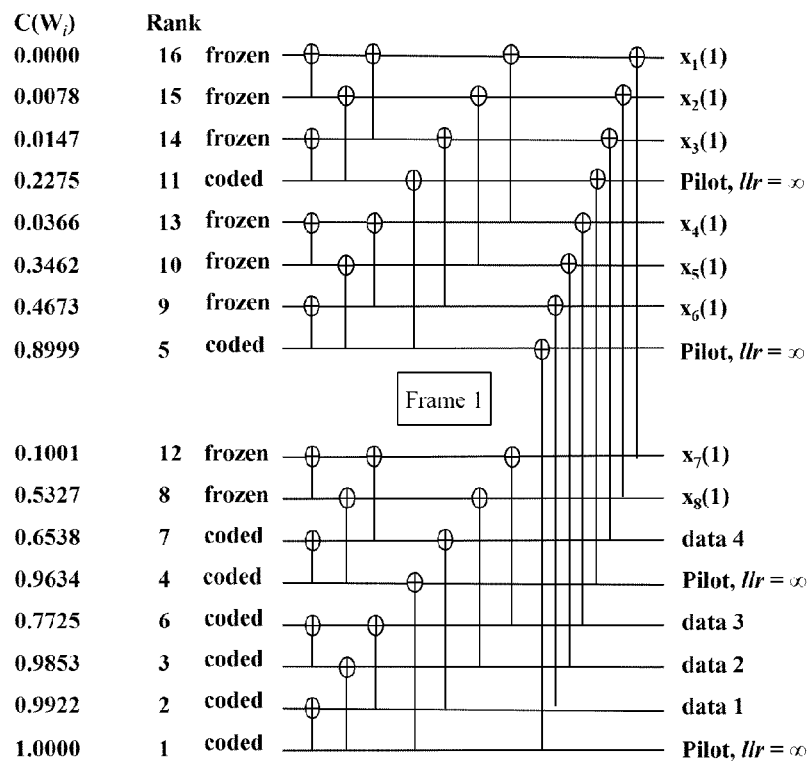

[FIG. 27B]
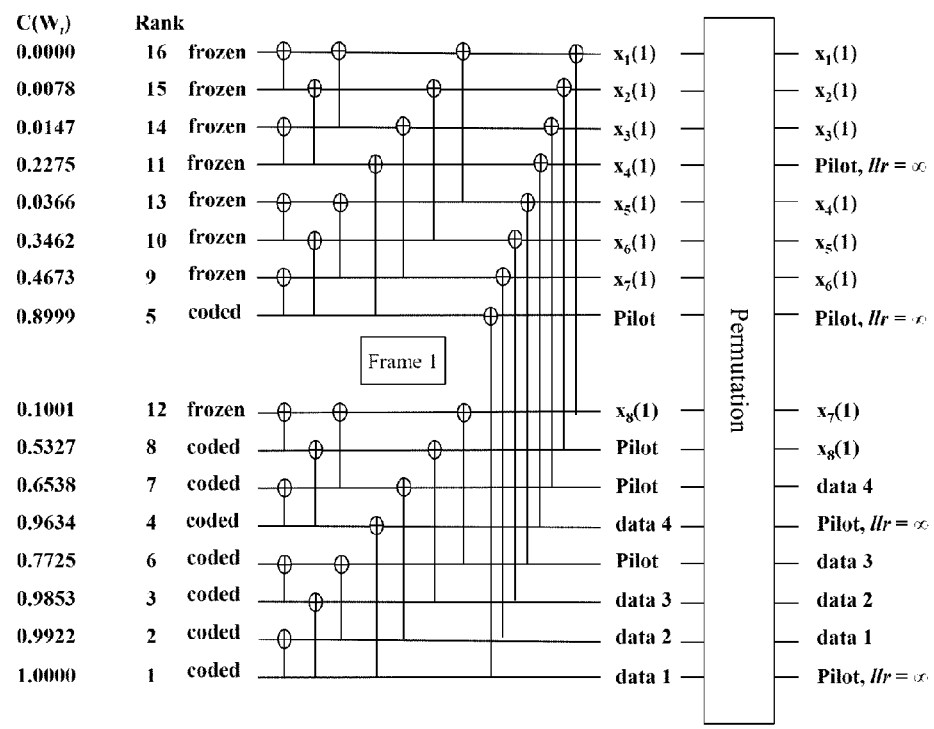

[FIG. 28A]
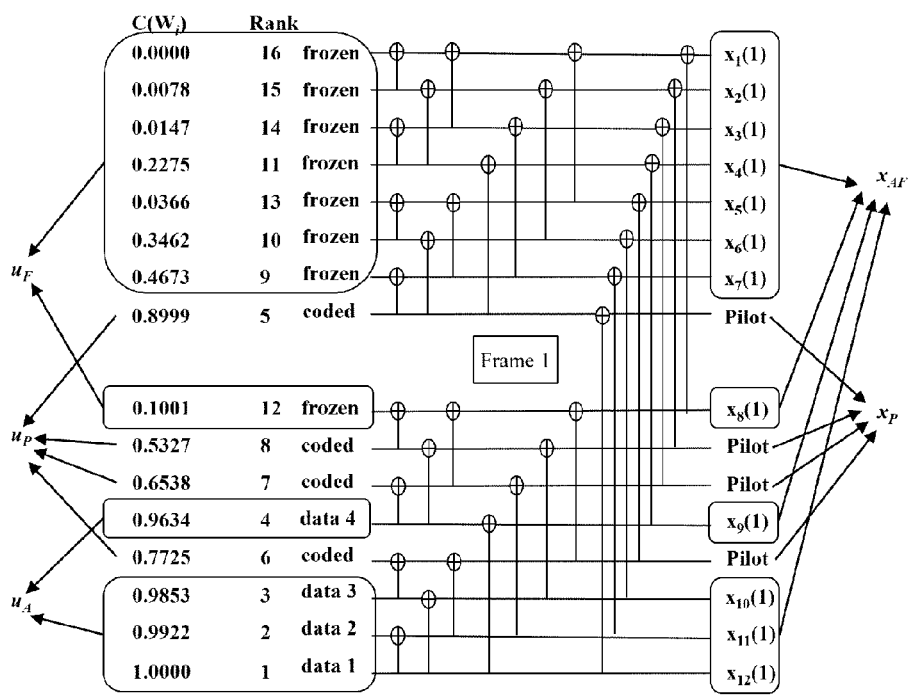

[FIG. 28B]
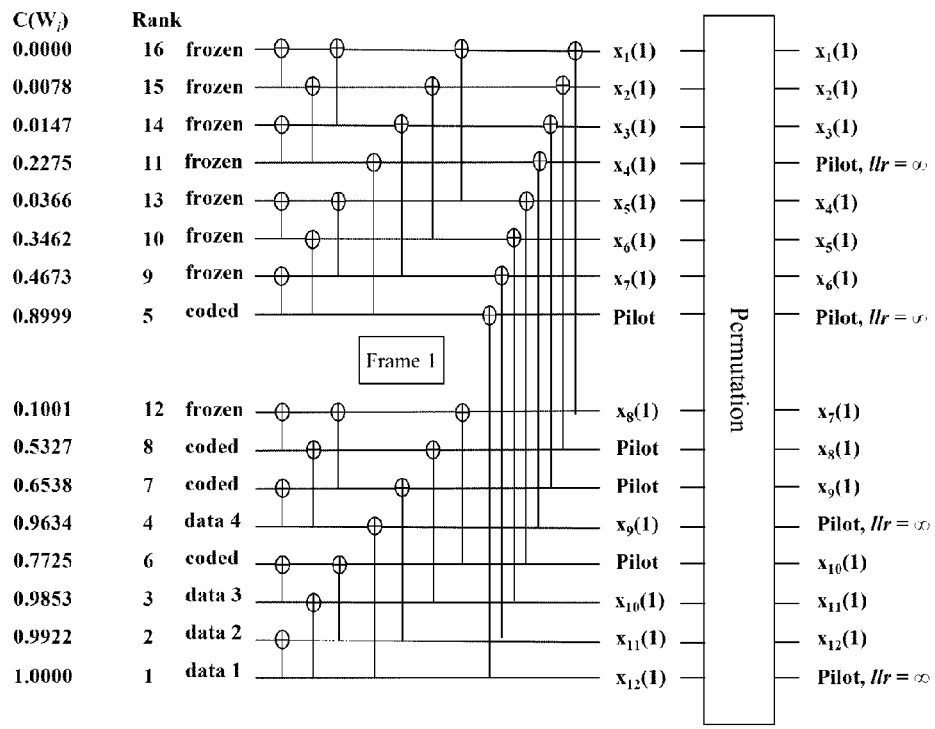
[FIG. 29]
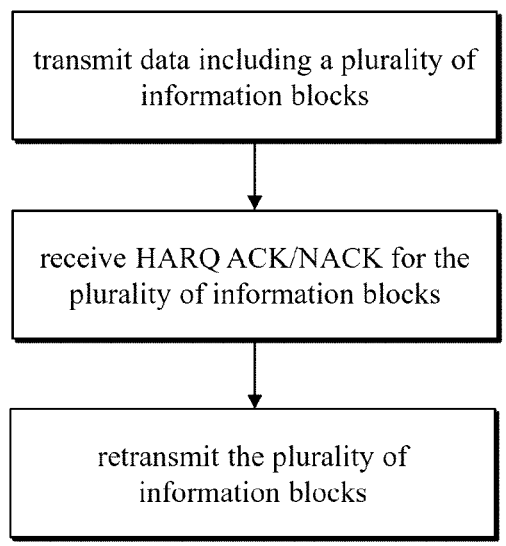

[FIG. 30]
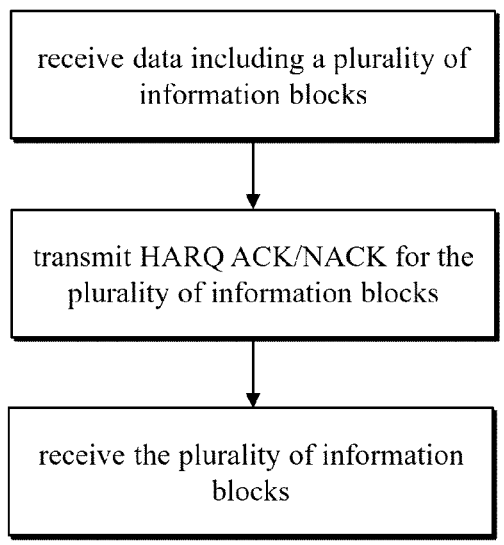

METHOD AND APPARATUS FOR TRANSMITTING DATA ON BASIS OF POLAR CODING IN WIRELESS COMMUNICATION SYSTEM

This application is the National Stage filing under 35 U.S.C. 371 of International Application No. PCT/KR2019/017092 filed on Dec. 5, 2019, which claims priority to Korean Patent Application No. 10-2018-0155495 filed on Dec. 5, 2018, the contents of which are hereby incorporated by reference herein in their entirety.

TECHNICAL FIELD

The present disclosure relates to a method and apparatus for transmitting data based on polar coding in a wireless communication system, and more particularly, to a method and apparatus for processing retransmission based on polar coding according to machine learning.

BACKGROUND ART

In digital communication systems, it is important to transfer information in the form of bits from a transmitter to a receiver without errors. To this end, various error correction codes have been proposed, and among these codes, polar codes recently proposed by Arikan have shown excellent performance. Non-systematic polar codes were first proposed, and then systematic polar codes have been developed.

Recently, polar codes have been researched by many people in various ways and adopted as a standard technology for fifth generation (5G) wireless communication systems as well. Although a lot of work has been done on polar codes in the prior art, the following limitations have remained unsolved.

Various hybrid automatic repeat request (HARQ) methods have been proposed based on polar codes. However, these proposals have the following problems: retransmission efficiency is degraded; and it is difficult to fully use the channel polarization of polar codes.

In wireless communication systems, a receiver measures a channel and performs decoding based on the channel measurement. For the channel measurement, a transmitter transmits relatively a large number of pilot signals, and overhead due to the pilot signals is not insignificant. In the prior art, since the problem in the pilot signal transmission has been considered separately from error correction codes, performance optimization has not been achieved from the perspective of the whole system.

One of the communication technologies adopted as the 5G standards is a non-orthogonal multiple access (NOMA) technology. The NOMA technology allows simultaneous data transmission between multiple users to achieve the maximum transfer rate on limited system resources. Since the NOMA technology and error correction codes have been considered separately, the performance optimization has not been discussed from the perspective of the whole system.

If polar codes, channel measurement, and NOMA technologies are combined, more efficient channel coding may be achieved.

DISCLOSURE

Technical Problem

An object of the present disclosure is to provide a method and apparatus for processing retransmission based on polar coding according to machine learning.

Another object of the present disclosure is to provide a method of effectively combining polar codes with hybrid automatic repeat and request (HARQ) based on machine learning to reduce the number of retransmissions and improve error correction performance.

Another object of the present disclosure is to provide a method of simultaneously optimizing transmission of a pilot signal for channel measurement and transmission of polar codes based on machine learning to improve the performance of a communication system.

Another object of the present disclosure is to provide a method of improving the performance of a non-orthogonal multiple access (NOMA) system based on machine learning.

It will be appreciated by persons skilled in the art that the objects that could be achieved with the present disclosure are not limited to what has been particularly described hereinabove and the above and other objects that the present disclosure could achieve will be more clearly understood from the following detailed description.

Technical Solution

In one aspect of the present disclosure, a method of transmitting data based on polar coding in a wireless communication system is provided. The method may include: transmitting data including a plurality of information blocks, wherein each of the plurality of information blocks may include a corresponding cyclic redundancy check (CRC); receiving a hybrid automatic repeat request acknowledgement/negative acknowledgement (HARQ ACK/NACK) for the transmitted data; learning to retransmit the plurality of information blocks; and retransmitting the plurality of information blocks based on the HARQ ACK/NACK. The learning may include: obtaining a current state $s_n$; obtaining actions to be applied to the current state $s_n$; and selecting an action for maximizing an expected reward value $Q_{n+1}$ from among the actions, wherein the expected reward value $Q_{n+1}$ may be obtained based on rewards $R_1, R_2, \ldots, R_n$ respectively corresponding to states $s_1, s_2, \ldots, s_n$. The plurality of information blocks may be retransmitted based on the selected action.

The expected reward value $Q_{n+1}$ may be defined by the following equation based on a latest reward $R_n$ among the rewards $R_1, R_2, \ldots, R_n$, and a previous expected reward value $Q_n$.

$$Q_{n+1} = \alpha R_n + (1-\alpha) Q_n$$

In the above equation, a learning rate $\alpha$ may be determined based on a range of channel variation.

The action may include a first action of transmitting the plurality of information blocks without coding, a second action of coding and transmitting the plurality of information blocks, and a third action of coding and transmitting some of the plurality of information blocks and transmitting the remaining blocks without coding.

Each of the rewards corresponding to the states may be obtained based on a cumulative number of bits of multiple information blocks transmitted up to now and the HARQ ACK/NACK, and the cumulative number of bits of multiple information blocks transmitted up to now and the HARQ ACK/NACK may be obtained based on the current state and the selected action.

The expected reward value $Q_{n+1}$ may be a weighted average of the rewards based on a learning rate. The learning rate may decrease monotonically as the learning progresses, or the learning rate may increase monotonically as the learning progresses.

The expected reward value $Q_{n+1}$ may be defined by the following equation based on the rewards $R_1, R_2, \ldots, R_n$.

$$Q_{n+1} = (1-\alpha)^n Q_1 + \sum_{i=1}^{n} \alpha(1-\alpha)^{n-1} R_i$$

The expected reward value $Q_{n+1}$ may be defined by the following equation based on a latest reward $R_n$ among the rewards $R_1, R_2, \ldots, R_n$ and a previous expected reward value $Q_n$.

$$Q_{n+1} = \alpha_n R_n + (1-\alpha) Q_n$$

In the above equation, a learning rate $\alpha_n$ may decrease monotonically as n increases.

Alternatively, the learning rate $\alpha_n$ may increase monotonically as n increases.

In another aspect of the present disclosure, an apparatus for transmitting data based on polar coding in a wireless communication system is provided. The apparatus may include: a transceiver; a memory; and at least one processor connected to the transceiver and the memory. The memory may be configured to store instructions that, when executed, cause the at least one processor to perform operations including: transmitting data including a plurality of information blocks, wherein each of the plurality of information blocks may include a corresponding CRC; receiving a HARQ ACK/NACK for the transmitted data; learning to retransmit the plurality of information blocks; and retransmitting the plurality of information blocks based on the HARQ ACK/NACK. The learning may include: obtaining a current state $s_n$; obtaining actions to be applied to the current state $s_n$; and selecting an action for maximizing an expected reward value $Q_{n+1}$ from among the actions, wherein the expected reward value $Q_{n+1}$ may be obtained based on rewards $R_1, R_2, \ldots, R_n$, respectively corresponding to states $s_1, s_2, \ldots, s_n$. The plurality of information blocks may be retransmitted based on the selected action.

The apparatus may be mounted on an autonomous driving apparatus configured to communicate with at least one of a mobile terminal, a base station, or an autonomous driving vehicle.

Advantageous Effects

According to the present disclosure, retransmission based on polar coding may be processed by machine learning.

According to the present disclosure, the performance of a wireless communication system using polar coding may be improved by machine learning.

The present disclosure may provide a polar code-based HARQ method for performance improvement when polar codes are used for hybrid automatic repeat request (HARQ) based on machine learning.

The present disclosure may provide a method of improving performance by combining polar coding with a non-orthogonal multiple access (NOMA) system, which has recently been spotlighted as a standard technology for 5G wireless communication systems, based on machine learning.

According to the present disclosure, it is possible to improve the performance of retransmission based on polar coding, the performance of retransmission in a NOMA system, and HARQ performance without prior knowledge about channel or system environments or any mathematical modeling therefor.

According to the present disclosure, maximum channel estimation and decoding effects may be obtained by adding an optimal amount of pilot signals to a polar code.

The effects that can be achieved through the embodiments of the present disclosure are not limited to what has been particularly described hereinabove and other effects which are not described herein can be derived by those skilled in the art from the following detailed description.

DESCRIPTION OF DRAWINGS

The accompanying drawings, which are included to provide a further understanding of the disclosure and are incorporated in and constitute a part of this specification, illustrate embodiments of the disclosure.

FIG. 1A illustrates a communication system applied to the present disclosure.

FIG. 1B illustrates wireless devices applicable to the present disclosure.

FIG. 1C illustrates other examples of wireless devices applicable to the present disclosure.

FIG. 2 is a diagram illustrating a frame structure of a new radio access technology (new RAT or NR).

FIG. 3 illustrates a resource grid of NR.

FIG. 4 is a diagram for explaining a channel coding method according to the present disclosure.

FIGS. 5 and 6 are diagrams for explaining a modulation method according to the present disclosure.

FIG. 7 is a diagram for explaining reinforcement learning.

FIG. 8 is a diagram for explaining a backpropagation method in a neural network.

FIG. 9 is a diagram for explaining a prediction method in an artificial neural network.

FIG. 10A is a diagram for explaining a method of operating a recurrent neural network.

FIG. 10B is a diagram for explaining an operating method of long short-term memory (LSTM).

FIG. 11 is a diagram for explaining a method of adding a cyclic redundancy check (CRC) to a polar code and a method of encoding and decoding a polar code using multiple CRCs.

FIG. 12 is a diagram for explaining a retransmission method for polar codes.

FIG. 13 is a diagram for explaining a NOMA system model with two users.

FIG. 14 shows NOMA system method 1 (method 1) based on polar coding.

FIG. 15 shows NOMA system method 2 (method 2) based on polar coding.

FIG. 16 is a diagram conceptually representing FIGS. 14 and 15.

FIG. 17 shows a retransmission method in a NOMA system using only one CRC for each layer.

FIG. 18 is a diagram for explaining a method of actively changing the value of c depending on channel environments according to the present disclosure.

FIG. 19 is a diagram for explaining a method of actively changing the value of c depending on channel environments (e.g., channel coherence time) according to the present disclosure.

FIGS. 20 and 21 are diagrams for explaining a method of actively changing the value of depending on channel environments according to the present disclosure.

FIG. 22 is a diagram for explaining a method of actively changing the value of a depending on channel environments according to the present disclosure.

FIG. 23 is a diagram for explaining optimization of a HARQ procedure and a system model.

FIG. 24 shows a case in which one codeword includes four information blocks.

FIG. 25 is a diagram for explaining a retransmission method in a NOMA system using one CRC in one layer.

FIG. 26 is a diagram for explaining a retransmission method in a NOMA system using a plurality of CRCs in one layer.

FIGS. 27A and 27B are diagrams for explaining a method of combining a systematic polar code with channel measurement according to the present disclosure.

FIG. 28A is a diagram for explaining a method of combining a non-systematic polar code with channel measurement according to the present disclosure, and FIG. 28B is a diagram for explaining a method of combining a non-systematic polar code with channel measurement where permutation is used to arrange pilot signals at a regular interval according to the present disclosure.

FIG. 29 is a diagram for explaining a method of transmitting data based on polar coding according to the present disclosure.

FIG. 30 is a diagram for explaining a method of receiving data based on polar coding according to the present disclosure.

BEST MODE

Reference will now be made in detail to the preferred embodiments of the present disclosure, examples of which are illustrated in the accompanying drawings. In the following detailed description of the disclosure includes details to help the full understanding of the present disclosure. Yet, it is apparent to those skilled in the art that the present disclosure can be implemented without these details. For instance, although the following descriptions are made in detail on the assumption that a mobile communication system includes 3GPP LTE system and 3GPP LTE-A, the following descriptions are applicable to other random mobile communication systems in a manner of excluding unique features of the 3GPP LTE and 3GPP LTE-A.

Occasionally, to prevent the present disclosure from getting vaguer, structures and/or devices known to the public are skipped or can be represented as block diagrams centering on the core functions of the structures and/or devices. Wherever possible, the same reference numbers will be used throughout the drawings to refer to the same or like parts.

Besides, in the following description, assume that a terminal is a common name of such a mobile or fixed user stage device as a user equipment (UE), a mobile station (MS), an advanced mobile station (AMS) and the like. And, assume that a base station (BS) is a common name of such a random node of a network stage communicating with a terminal as a Node B (NB), an eNode B (eNB), an access point (AP) and the like.

In a mobile communication system, a user equipment is able to receive information in downlink and is able to transmit information in uplink as well. Information transmitted or received by the user equipment node may include various kinds of data and control information. In accordance with types and usages of the information transmitted or received by the user equipment, various physical channels may exist.

The embodiments of the present disclosure can be applied to various wireless access systems such as Code Division Multiple Access (CDMA), Frequency Division Multiple Access (FDMA), Time Division Multiple Access (TDMA), Orthogonal Frequency Division Multiple Access (OFDMA), Single Carrier Frequency Division Multiple Access (SC-FDMA), etc. CDMA may be implemented as a radio technology such as Universal Terrestrial Radio Access (UTRA) or CDMA2000. TDMA may be implemented as a radio technology such as Global System for Mobile communications (GSM)/General packet Radio Service (GPRS)/Enhanced Data Rates for GSM Evolution (EDGE). OFDMA may be implemented as a radio technology such as IEEE 802.11 (Wi-Fi), IEEE 802.16 (WiMAX), IEEE 802.20, Evolved UTRA (E-UTRA), etc. UTRA is a part of Universal Mobile Telecommunications System (UMTS). 3GPP LTE is a part of Evolved UMTS (E-UMTS) using E-UTRA, adopting OFDMA for DL and SC-FDMA for UL. LTE-Advanced (LTE-A) is an evolution of 3GPP LTE.

Moreover, in the following description, specific terminologies are provided to help the understanding of the present disclosure. And, the use of the specific terminology can be modified into another form within the scope of the technical idea of the present disclosure.

FIG. 1A illustrates a communication system 1 applied to the present disclosure.

Referring to FIG. 1A, the communication system 1 applied to the present disclosure includes wireless devices, BSs, and a network. The wireless devices refer to devices performing communication by radio access technology (RAT) (e.g., 5G New RAT (NR) or LTE), which may also be called communication/radio/5G devices. The wireless devices may include, but no limited to, a robot 100a, vehicles 100b-1 and 100b-2, an extended reality (XR) device 100c, a hand-held device 100d, a home appliance 100e, an IoT device 100f, and an artificial intelligence (AI) device/server 400. For example, the vehicles may include a vehicle equipped with a wireless communication function, an autonomous driving vehicle, and a vehicle capable of performing vehicle-to-vehicle (V2V) communication. The vehicles may include an unmanned aerial vehicle (UAV) (e.g., a drone). The XR device may include an augmented reality (AR)/virtual reality (VR)/mixed reality (MR) device, and may be implemented in the form of a head-mounted device (HMD), a head-up display (HUD) mounted in a vehicle, a television (TV), a smartphone, a computer, a wearable device, a home appliance, a digital signage, a vehicle, a robot, and so on. The hand-held device may include a smartphone, a smartpad, a wearable device (e.g., a smartwatch or smart glasses), and a computer (e.g., a laptop). The home appliance may include a TV, a refrigerator, and a washing machine. The IoT device may include a sensor and a smart meter. For example, the BSs and the network may be implemented as wireless devices, and a specific wireless device 200a may operate as a BS/network node for other wireless devices.

The wireless devices 100a to 100f may be connected to the network 300 via the BSs 200. An AI technology may be applied to the wireless devices 100a to 100f, and the wireless devices 100a to 100f may be connected to the AI server 400 via the network 300. The network 300 may be configured by using a 3G network, a 4G (e.g., LTE) network, or a 5G (e.g., NR) network. Although the wireless devices 100a to 100f may communicate with each other through the BSs 200/network 300, the wireless devices 100a to 100f may perform direct communication (e.g., sidelink communication) with each other without intervention of the BSs/network. For example, the vehicles 100b-1 and 100b-2 may perform direct communication (e.g. V2V/vehicle-to-everything (V2X) communication). The IoT device (e.g., a sensor) may perform direct communication with other IoT devices (e.g., sensors) or other wireless devices 100a to 100f.

Wireless communication/connections 150a, 150b, or 150c may be established between the wireless devices 100a to 100f and the BSs 200, or between the BSs 200. Herein, the wireless communication/connections may be established through various RATs (e.g., 5G NR) such as UL/DL communication 150a, sidelink communication 150b (or, D2D communication), or inter-BS communication 150c (e.g. relay, integrated access backhaul (IAB)). A wireless device and a BS/a wireless devices, and BSs may transmit/receive radio signals to/from each other through the wireless communication/connections 150a, 150b, and 150c. To this end, at least a part of various configuration information configuring processes, various signal processing processes (e.g., channel encoding/decoding, modulation/demodulation, and resource mapping/demapping), and resource allocating processes, for transmitting/receiving radio signals, may be performed based on the various proposals of the present disclosure.

FIG. 1B illustrates wireless devices applicable to the present disclosure.

Referring to FIG. 1B, a first wireless device 100 and a second wireless device 200 may transmit radio signals through a variety of RATs (e.g., LTE and NR). Herein, {the first wireless device 100 and the second wireless device 200} may correspond to {the wireless devices 100a to 100f and the BSs 200} and/or {the wireless devices 100a to 100f and the wireless devices 100a to 100f} of FIG. 1A.

The first wireless device 100 may include at least one processor 102 and at least one memory 104, and may further include at least one transceiver 106 and/or at least one antenna 108. The processor 102 may control the memory 104 and/or the transceiver 106 and may be configured to implement the descriptions, functions, procedures, proposals, methods, and/or operational flowcharts disclosed in this document. For example, the processor 102 may process information within the memory 104 to generate first information/signal and then transmit a radio signal including the first information/signal through the transceiver 106. The processor 102 may receive a radio signal including second information/signal through the transceiver 106 and then store information obtained by processing the second information/signal in the memory 104. The memory 104 may be coupled to the processor 102 and store various types of information related to operations of the processor 102. For example, the memory 104 may store software code including commands for performing a part or all of processes controlled by the processor 102 or for performing the descriptions, functions, procedures, proposals, methods, and/or operational flowcharts disclosed in this document. Herein, the processor 102 and the memory 104 may be a part of a communication modem/circuit/chip designed to implement an RAT (e.g., LTE or NR). The transceiver 106 may be coupled to the processor 102 and transmit and/or receive radio signals through the at least one antenna 108. The transceiver 106 may include a transmitter and/or a receiver. The transceiver 106 may be interchangeably used with an RF unit. In the present disclosure, a wireless device may refer to a communication modem/circuit/chip.

The second wireless device 200 may include at least one processor 202 and at least one memory 204, and may further include at least one transceiver 206 and/or at least one antenna 208. The processor 202 may control the memory 204 and/or the transceiver 206 and may be configured to implement the descriptions, functions, procedures, proposals, methods, and/or operational flowcharts disclosed in this document. For example, the processor 202 may process information within the memory 204 to generate third information/signal and then transmit a radio signal including the third information/signal through the transceiver 206. The processor 202 may receive a radio signal including fourth information/signal through the transceiver 206 and then store information obtained by processing the fourth information/signal in the memory 204. The memory 204 may be coupled to the processor 202 and store various types of information related to operations of the processor 202. For example, the memory 204 may store software code including commands for performing a part or all of processes controlled by the processor 202 or for performing the descriptions, functions, procedures, proposals, methods, and/or operational flowcharts disclosed in this document. Herein, the processor 202 and the memory 204 may be a part of a communication modem/circuit/chip designed to implement an RAT (e.g., LTE or NR). The transceiver 206 may be coupled to the processor 202 and transmit and/or receive radio signals through the at least one antenna 208. The transceiver 206 may include a transmitter and/or a receiver. The transceiver 206 may be interchangeably used with an RF unit. In the present disclosure, a wireless device may refer to a communication modem/circuit/chip.

Hereinafter, hardware elements of the wireless devices 100 and 200 will be described in greater detail. One or more protocol layers may be implemented by, but not limited to, one or more processors 102 and 202. For example, the one or more processors 102 and 202 may implement one or more layers (e.g., functional layers such as PHY, MAC, RLC, PDCP, RRC, and SDAP). The one or more processors 102 and 202 may generate one or more protocol data units (PDUs) and/or one or more service data units (SDUs) according to the descriptions, functions, procedures, proposals, methods, and/or operational flowcharts disclosed in this document. The one or more processors 102 and 202 may generate messages, control information, data, or information according to the descriptions, functions, procedures, proposals, methods, and/or operational flowcharts disclosed in this document. The one or more processors 102 and 202 may generate signals (e.g., baseband signals) including PDUs, SDUs, messages, control information, data, or information according to the descriptions, functions, procedures, proposals, methods, and/or operational flowcharts disclosed in this document and provide the generated signals to the one or more transceivers 106 and 206. The one or more processors 102 and 202 may receive the signals (e.g., baseband signals) from the one or more transceivers 106 and 206 and acquire the PDUs, SDUs, messages, control information, data, or information according to the descriptions, functions, procedures, proposals, methods, and/or operational flowcharts disclosed in this document.

The one or more processors 102 and 202 may be referred to as controllers, microcontrollers, microprocessors, or microcomputers. The one or more processors 102 and 202 may be implemented in hardware, firmware, software, or a combination thereof. For example, one or more application specific integrated circuits (ASICs), one or more digital signal processors (DSPs), one or more digital signal processing devices (DSPDs), one or more programmable logic devices (PLDs), or one or more field programmable gate arrays (FPGAs) may be included in the one or more processors 102 and 202. The descriptions, functions, procedures, proposals, methods, and/or operational flowcharts disclosed in this document may be implemented in firmware or software, which may be configured to include modules, procedures, or functions. Firmware or software configured to perform the descriptions, functions, procedures, proposals, methods, and/or operational flowcharts disclosed in this document may be included in the one or more processors 102 and 202, or may be stored in the one or more memories 104 and 204 and executed by the one or more processors 102 and 202. The descriptions, functions, procedures, proposals, methods, and/or operational flowcharts disclosed in this document may be implemented as code, instructions, and/or a set of instructions in firmware or software.

The one or more memories 104 and 204 may be coupled to the one or more processors 102 and 202 and store various types of data, signals, messages, information, programs, code, instructions, and/or commands. The one or more memories 104 and 204 may be configured as read-only memories (ROMs), random access memories (RAMs), electrically erasable programmable read-only memories (EPROMs), flash memories, hard drives, registers, cash memories, computer-readable storage media, and/or combinations thereof. The one or more memories 104 and 204 may be located at the interior and/or exterior of the one or more processors 102 and 202. The one or more memories 104 and 204 may be coupled to the one or more processors 102 and 202 through various technologies such as wired or wireless connection.

The one or more transceivers 106 and 206 may transmit user data, control information, and/or radio signals/channels, mentioned in the methods and/or operational flowcharts of this document, to one or more other devices. The one or more transceivers 106 and 206 may receive user data, control information, and/or radio signals/channels, mentioned in the descriptions, functions, procedures, proposals, methods, and/or operational flowcharts disclosed in this document, from one or more other devices. For example, the one or more transceivers 106 and 206 may be coupled to the one or more processors 102 and 202 and transmit and receive radio signals. For example, the one or more processors 102 and 202 may control the one or more transceivers 106 and 206 to transmit user data, control information, or radio signals to one or more other devices. The one or more processors 102 and 202 may control the one or more transceivers 106 and 206 to receive user data, control information, or radio signals from one or more other devices. The one or more transceivers 106 and 206 may be coupled to the one or more antennas 108 and 208 and configured to transmit and receive user data, control information, and/or radio signals/channels, mentioned in the descriptions, functions, procedures, proposals, methods, and/or operational flowcharts disclosed in this document, through the one or more antennas 108 and 208. In this document, the one or more antennas may be a plurality of physical antennas or a plurality of logical antennas (e.g., antenna ports). The one or more transceivers 106 and 206 may convert received radio signals/channels etc. from RF band signals into baseband signals in order to process received user data, control information, radio signals/channels, etc. using the one or more processors 102 and 202. The one or more transceivers 106 and 206 may convert the user data, control information, radio signals/channels, etc. processed using the one or more processors 102 and 202 from the base band signals into the RF band signals. To this end, the one or more transceivers 106 and 206 may include (analog) oscillators and/or filters.

FIG. 1C illustrates another example of wireless devices applied to the present disclosure.

The wireless devices may be implemented in various forms according to use-cases/services (refer to FIG. 1A).

Referring to FIG. 1C, wireless devices 100 and 200 may correspond to the wireless devices 100 and 200 of FIG. 1B and may be configured as various elements, components, units/portions, and/or modules. For example, each of the wireless devices 100 and 200 may include a communication unit 110, a control unit 120, a memory unit 130, and additional components 140. The communication unit may include a communication circuit 112 and transceiver(s) 114. For example, the communication circuit 112 may include the one or more processors 102 and 202 and/or the one or more memories 104 and 204 of FIG. 2B. For example, the transceiver(s) 114 may include the one or more transceivers 106 and 206 and/or the one or more antennas 108 and 208 of FIG. 2B. The control unit 120 is electrically coupled to the communication unit 110, the memory unit 130, and the additional components 140 and provides overall control to operations of the wireless devices. For example, the control unit 120 may control an electric/mechanical operation of the wireless device based on programs/code/commands/information stored in the memory unit 130. The control unit 120 may transmit the information stored in the memory unit 130 to the outside (e.g., other communication devices) via the communication unit 110 through a wireless/wired interface or store, in the memory unit 130, information received through the wireless/wired interface from the outside (e.g., other communication devices) via the communication unit 110.

The additional components 140 may be configured in various manners according to the types of wireless devices. For example, the additional components 140 may include at least one of a power unit/battery, an input/output (I/O) unit, a driver, and a computing unit. The wireless device may be configured as, but not limited to, the robot (100a of FIG. 1A), the vehicles (100b-1 and 100b-2 of FIG. 1A), the XR device (100c of FIG. 1A), the hand-held device (100d of FIG. 1A), the home appliance (100e of FIG. 1A), the IoT device (100f of FIG. 1A), a digital broadcasting terminal, a hologram device, a public safety device, an MTC device, a medicine device, a FinTech device (or a finance device), a security device, a climate/environment device, the AI server/device (400 of FIG. 1A), the BSs (200 of FIG. 1A), a network node, etc. The wireless device may be mobile or fixed according to a use-case/service.

In FIG. 1C, all of the various elements, components, units/portions, and/or modules in the wireless devices 100 and 200 may be coupled to each other through a wired interface or at least a part thereof may be wirelessly coupled to each other through the communication unit 110. For example, in each of the wireless devices 100 and 200, the control unit 120 and the communication unit 110 may be coupled by wire, and the control unit 120 and first units (e.g., 130 and 140) may be wirelessly coupled through the communication unit 110. Each element, component, unit/portion, and/or module within the wireless devices 100 and 200 may further include one or more elements. For example, the control unit 120 may be configured as a set of one or more processors. For example, the control unit 120 may be configured as a set of a communication control processor, an application processor, an electronic control unit (ECU), a graphical processing unit, and a memory control processor. In another example, the memory unit 130 may be configured as a random access memory (RAM), a dynamic RAM (DRAM), a read only memory (ROM), a flash memory, a volatile memory, a non-volatile memory, and/or a combination thereof.

According to the present disclosure, a device for performing channel coding based on polar coding may include a transceiver, a memory, and at least one processor connected to the transceiver and memory.

The memory may be configured to store instructions that, when executed by the at least one processor, cause the at least one processor to perform operations.

FIG. 2 is a diagram illustrating a frame structure in NR.

The NR system may support multiple numerologies. A numerology may be defined by a subcarrier spacing (SCS) and a cyclic prefix (CP) overhead. Multiple SCSs may be derived by scaling a default SCS by an integer N (or μ). Further, even though it is assumed that a very small SCS is not used in a very high carrier frequency, a numerology to be used may be selected independently of a frequency band. Further, the NR system may support various frame structures according to multiple numerologies.

Now, a description will be given of OFDM numerologies and frame structures which may be considered for the NR system. Multiple OFDM numerologies supported by the NR system may be defined as listed in Table 1.

TABLE 1

| μ | $\Delta f = 2^{\mu} \cdot 15$ [kHz] | Cyclic prefix(CP) |
|---|---|---|
| 0 | 15 | Normal |
| 1 | 30 | Normal |
| 2 | 60 | Normal, Extended |
| 3 | 120 | Normal |
| 4 | 240 | Normal |

The NR system supports multiple numerologies (e.g., SCSs) to support various 5G services. For example, in an SCS of 15 kHz, the NR system supports a wide area in conventional cellular bands. In an SCS of 30/60 kHz, the NR system supports a dense urban environment, low latency, and wide carrier bandwidth. In an SCS of 60 kHz or above, the NR system supports a bandwidth higher than 24.25 GHz to overcome phase noise.

NR frequency bands are divided into two frequency ranges: frequency range 1 (FR1) and frequency range 2 (FR2). FR1 covers sub-6 GHz frequency bands, and FR2 covers frequency bands above 6 GHz, i.e., bands in the millimeter wavelength (mmWave).

Table 2 shows the definitions of the NR frequency ranges.

TABLE 2

| Frequency Range designation | Corresponding frequency range | Subcarrier Spacing |
|---|---|---|
| FR1 | 450MHz - 6000MHz | 15, 30, 60kHz |
| FR2 | 24250MHz - 52600MHz | 60, 120, 240kHz |

Regarding a frame structure in the NR system, the time-domain sizes of various fields are represented as multiples of a basic time unit, $T_c=1/(\Delta f_{max} \cdot N_f)$ where $\Delta f_{max}=480 \cdot 10^3$ Hz and $N_f=4096$. DL and UL transmissions are organized into radio frames each having a duration of $T_f=(\Delta f_{max} \cdot N_f/100) \cdot T_c=10$ ms. $T_c$ and $T_s$ have the following relationship: $T_s/T_c=64$, where $T_s=1/((15 \text{ kHz}) \cdot 2048)$ is a basic time unit for LTE and a sampling time. Each radio frame includes 10 subframes each having a duration of $T_{sf}=(\Delta f_{max} \cdot N_f/1000) \cdot T_c=1$ ms. In this case, there may exist one set of frames for UL and one set of frames for DL. For a numerology μ, slots are numbered with $n_s^\mu \in \{0, \ldots, N^{slot,\mu}_{subframe}-1\}$ in an increasing order in a subframe, and with $n_{s,f}^\mu \in \{0, \ldots, N^{slot,\mu}_{frame}-1\}$ in an increasing order in a radio frame. One slot includes $N^\mu_{symb}$ consecutive OFDM symbols, and $N^\mu_{symb}$ depends on a used numerology and slot configuration. The start of a slot $n_s^\mu$ in a subframe is aligned in time with the start of an OFDM symbol $n_s^\mu \cdot N^\mu_{symb}$ in the same subframe. All UEs are not capable of simultaneous transmission and reception, which implies that all OFDM symbols of a DL slot or a UL slot may not be used. Table 3 lists the number $N^{slot}_{symb}$ of symbols per slot, the number $N^{frame,\mu}_{slot}$ of slots per frame, and the number of slots per subframe, for each SCS in a normal CP case, and Table 4 lists the number of symbols per slot, the number of slots per frame, and the number of slots per subframe, for each SCS in an extended CP case.

TABLE 3

| μ | $N^{slot}_{symb}$ | $N^{frame,\mu}_{slot}$ | $N^{subframe,\mu}_{slot}$ |
|---|---|---|---|
| 0 | 14 | 10 | 1 |
| 1 | 14 | 20 | 2 |
| 2 | 14 | 40 | 4 |
| 3 | 14 | 80 | 8 |
| 4 | 14 | 160 | 16 |

TABLE 4

| μ | $N^{slot}_{symb}$ | $N^{frame,\mu}_{slot}$ | $N^{subframe,\mu}_{slot}$ |
|---|---|---|---|
| 2 | 12 | 40 | 4 |

FIG. 2 illustrates an example with p=2, that is, an SCS of 60 kHz, in which referring to Table 2 one subframe may include four slots. One subframe={1, 2, 4} slots in FIG. 2 which is exemplary, and the number of slot(s) which may be included in one subframe is defined as listed in Table 2.

Further, a mini-slot may include 2, 4 or 7 symbols, fewer symbols than 2, or more symbols than 7.

In the NR system, an antenna port, a resource grid, a resource element, a resource block, a carrier part, etc. may be considered as physical resources. Hereinafter, the physical resources considerable in the NR system will be described in detail.

First, an antenna port may be defined such that a channel conveying symbols on the antenna port is capable of being inferred from a channel conveying other symbols on the same antenna port. When the large-scale properties of a channel carrying symbols on one antenna port are inferred from a channel carrying symbols on another antenna port, the two antenna ports may be said to be in quasi co-located or quasi co-location (QC/QCL) relationship. The large-scale properties may include at least one of the following parameters: delay spread, Doppler spread, frequency shift, average received power, received timing, average delay, and spatial reception (Rx). The spatial Rx parameter refer to a spatial (Rx) channel characteristic parameter such as angle of arrival.

FIG. 3 illustrates a resource grid in the NR system.

Referring to FIG. 3, a resource grid includes $N_{RB}^\mu N_{sc}^{RB}$ subcarriers in the time domain, and one subframe 14·2μ OFDM symbols, which is exemplary and thus should not be construed as limiting the disclosure. In the NR system, a transmitted signal is described by one or more resource grids including $N_{RB}^\mu N_{sc}^{RB}$ subcarriers and $2^\mu N_{symb}^{(\mu)}$ OFDM symbols, where $N_{RB}^\mu \leq N_{RB}^{max,\mu} \cdot N_{RB}^{max,\mu}$ represents a maximum transmission bandwidth, which may be different for UL and DL as well as according to numerologies. In this case, one resource grid may be configured for each neurology μ and each antenna port p, as illustrated in FIG. 4. Each element of the resource grid for the numerology μ and the antenna port p is referred to as an RE, which is uniquely identified by an index pair (k, l̄) where k=0, ...., $N_{RB}^\mu N_{sc}^{RB}-1$ is a frequency-domain index and l̄=0, ...., $2^\mu N_{symb}^{(\mu)}-1$ indicates the position of a symbol in a subframe. An RE in a slot is indicated by an index pair (k,l) where l=0, ...., $N_{symb}^\mu-1$. An RE (k,l̄) for the numerology μ and the antenna port p corresponds to a complex value $a_{k,l̄}^{(p,\mu)}$. When there is no risk of confusion or a specific antenna port or a numerology is not specified, the indexes p and μ may be dropped, and as a result, the complex value may be $a_{k,l̄}^{(p)}$ or $a_{k,l̄}$. In addition, an RB is defined as $N_{sc}^{RB}=12$ consecutive subcarriers in the frequency domain.

Considering that a UE may be incapable of supporting a wide bandwidth supported in the NR system, the UE may be configured to operate in a part of the frequency BW of a cell (hereinafter referred to as a bandwidth part (BWP)).

In the NR system, resource blocks may be divided into physical resource blocks defined within the BWP and common resource blocks numbered from 0 upward in the frequency domain for an SCS configuration μ.

Point A is obtained as follows.

For a PCell downlink, offsetToPointA represents the frequency offset between point A and the lowest subcarrier of the lowest resource block overlapping with an SS/PBCH block used by the UE for initial cell selection, which is expressed in units of resource blocks on the assumption of an SCS of 15 kHz for FR1 and an SCS of 60 kHz for FR2.

For other cases, absoluteFrequencyPointA represents the frequency location of point A expressed as in the absolute radio-frequency channel number (ARFCN).

The center of subcarrier 0 of common resource block 0 for the SCS configuration μ coincides with point A, which act as the reference point for resource grids. The relationship between a common resource block number $n_{CRB}^\mu$ in the frequency domain and a resource elements (k,l) for the SCS configuration μ is given by Equation 1.

$$n_{CRB}^\mu = \left\lfloor \frac{k}{N_{sc}^{RB}} \right\rfloor \quad \text{[Equation 1]}$$

In Equation 1, k is defined relative to point A such that k=0 corresponds to a subcarrier around point A. Physical resource blocks are numbered from 0 to $N^{size}_{BWP,i}-1$ within the BWP, where i is the number of the BWP. The relationship between a physical resource block $n_{PRB}$ and a common resource block $n_{CRB}$ in BWP i is given by Equation 2.

$$n_{CRB}=n_{PRB}+N_{BWP,i}^{start} \quad \text{[Equation 2]}$$

In Equation 2, $N^{start}_{BWP,i}$ is a common resource block where the BWP starts relative to common resource block 0.

FIG. 4 is a diagram for explaining a channel coding method according to the present disclosure.

Data subject to channel coding is referred to as a transport block. Typically, depending on the performance of channel coding, the transport block is divided into code blocks, each of which has a size less than or equal to a predetermined value. For example, in turbo coding of 3GPP TS 36.212, the code block may have a maximum size of 6144 bits. In low density parity check (LDPC) coding of 3GPP TS 38.212, the code block may have a maximum size of 8448 bits (in base graph 1) or 3840 bits (in base graph 2). In polar coding, the code block may have a minimum size of 32 bits and a maximum size of 8192 bits. The code block may be subdivided into sub-blocks. In polar coding methods according to the present disclosure, an input bit sequence (265) ($c_{r0}$, $c_{r1}$, ..., $c_{r(Kr-1)}$) is interleaved, the interleaved input bit sequence (not shown in the drawing) ($c'_{r0}$, $c'_{r1}$, ..., $c'_{r(Kr-1)}$) may be encoded based on polar codes. The encoded bit sequence (270) ($d_{r0}$, $d_{r1}$, ..., $d_{r(Nr-1)}$) may be rate matched. The rate matching of the encoded bit sequence (270) may include: subdividing the encoded bit sequence into sub-blocks; interleaving each of the sub-blocks; performing bit selection for each of the interleaved sub-blocks; and interleaving coded bits again. The bit selection for each of the interleaved sub-blocks may include repeating, puncturing, or shortening some bits.

The channel coding method according to the present disclosure may include attaching a cyclic redundancy check (CRC) code to a transport block (S205); dividing the transport block into code blocks (S210); encoding the divided code blocks (S215); perform rate matching of the encoded code blocks (S220); and concatenating the rate-matched code blocks (S225).

In step S205, party bits with a length of L are attached to the transport block (255) ($a_0$, ..., $a_{A-1}$). The length L may be any one of 6, 11, 16, and 24. Typically, cyclic generator polynomials are used to generate party bits. In addition, scrambling operation may be applied to output bits (260) ($b_0$, ..., $b_{B-1}$), which depend on the CRC attachment, with a radio network temporary identifier (RNTI). Exclusive OR (EOR) operation may be applied between a scrambling sequence and corresponding bits based on the scrambling operation.

The output bits (260) ($b_0$, ..., $b_{B-1}$) depending on the CRC attachment may be segmented into code blocks (265) according to code block sizes. This is called code block segmentation. The code block sizes are determined by channel coding methods. A code block size suitable for each channel coding method may be determined theoretically or experimentally. For example, the segmented code blocks (265) ($c_{r0}$, ..., $c_{r(Kr-1)}$) may be encoded as encoded bits (270) ($d_{r0}$, ..., $d_{r(Nr-1)}$), respectively.

The encoded bits (270) ($d_{r0}$, ..., $d_{r(Nr-1)}$) are generated by applying channel coding to the code blocks (265) ($c_{r0}$, ..., $c_{r(Kr-1)}$) (S215). The generated encoded bits (270) may be rate-matched by shortening and puncturing. Alternatively, the encoded bits (270) may be rate-matched by sub-block interleaving, bit selection, and/or interleaving. That is, the encoded bits (270) ($d_{r0}$, ..., $d_{r(Nr-1)}$) are converted into rate-matched bits (275) ($f_{r0}$, ..., $f_{r(gr-1)}$) (S220). Typically, interleaving may refer to a process for changing a sequence of bits and reduce the occurrence of errors. The interleaving is designed in consideration of efficient de-interleaving.

Sub-block interleaving may mean a process for dividing a code block into a plurality of sub-blocks (e.g., 32 sub-blocks) and allocating bits based on the sub-block interleaving.

The bit selection may mean a process for increasing a bit sequence by repeating bits based on the number of bits to be rate-matched or decreasing the bit sequence based on shortening, puncturing, etc. The interleaving may mean a process for interleaving encoded bits after the bit selection.

In another example of the present disclosure, the rate matching may include the bit selection and interleaving. The sub-block interleaving is not mandatory.

After interleaving the encoded bits, code block concatenation is applied to concatenate the code blocks (275) so that a codeword (285) ($g_0$, ..., $g_{G-1}$) may be generated (S225). The generated codeword 280 may be equivalent to one transport block.

FIGS. 5 and 6 are diagrams for explaining a modulation method according to the present disclosure.

Referring to FIGS. 5 and 6, one or more codewords are input and scrambled (S305 and S405). For example, scrambling may be performed based on EOR operation between an input bit sequence and a predetermined bit sequence. The scrambled bits are modulated (S310 and S410), and the modulated symbols are mapped to layers (S315 and S415). The symbols mapped to the layers are precoded for antenna port mapping. The precoded symbols are mapped to resource elements (S325 and S425). The mapped symbols are generated as OFDM signals (S330 and S430) and transmitted through antennas.

The most important issue in digital communication systems is that information in the form of bits needs to be transmitted from a transmitter to a receiver without errors. To this end, various error correction codes have been proposed, and among these codes, polar codes recently proposed by Arikan have shown excellent performance. Non-systematic polar codes were first proposed, and then systematic polar codes have been developed.

Recently, polar codes have been researched by many people in various ways and adopted as a standard technology for 5G wireless communication systems as well. Although a lot of work has been done on polar codes in the prior art, the following limitations have remained unsolved.

Various hybrid automatic repeat request (HARQ) methods have been proposed based on polar codes. However, these proposals have the following problems: retransmission efficiency is degraded, or it is difficult to fully use the channel polarization of polar codes.

In wireless communication systems, the receiver measures a channel and performs decoding based on the channel measurement. For the channel measurement, the transmitter transmits relatively a large number of pilot signals, and overhead due to the pilot signals is not negligible. In the prior art, since the problem in the pilot signal transmission has been considered separately from error correction codes, performance optimization has not been achieved from the perspective of the whole system.

The present disclosure proposes a polar code based HARQ method for minimizing the number of times of retransmission and improving the performance of error correction by efficiently combining polar codes with HARQ.

The present disclosure proposes a method of improving the performance of a communication system by simultaneously optimizing pilot signal transmission for channel measurement and polar code transmission at a receiver.

FIGS. 7A and 7B are diagrams for showing performance improvement in polar coding based channel coding according to the present disclosure when pilot signals are applied to codewords of a polar code, compared to when puncturing is applied.

In information technology, a polar code is a linear block error correction code. The code structure is based on multiple recursive concatenation of short kernel codes which transform a physical channel into virtual outer channels.

The block length N of polar codes is a power of 2 ($=2^n$). That is, N may have a value of 2, 4, 8, 16, 32, 64, 128, etc.

For example, the generator matrix of polar codes with N=2 may be given by Equation 3.

$$G = \begin{bmatrix} 1 & 0 \\ 1 & 1 \end{bmatrix} \quad \text{[Equation 3]}$$

Based on Equation 3, the generator matrix of polar codes with N=8 may be given by Equation 4.

$$G = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 1 & 0 & 1 & 0 & 0 & 0 \\ 1 & 1 & 1 & 1 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix} \quad \text{[Equation 4]}$$

The generator matrix of polar codes, which are linear block codes, may be determined by the polar code block length, $N(=2^n)$.

The polar coding method according to the present disclosure is advantageous in that fast decoding is enabled because the generator matrix is easily determined and a reverse matrix thereof is rapidly computed due to the feature of the polar code generator matrix.

The present disclosure may solve various communication problems based on a multi-armed bandit algorithm, Q-learning, and deep Q-network (DQN). Such a method has the following main features: not only prior knowledge about channel or system environments but also any mathematical modeling therefor are not required, but optimal actions are taken and rewards are given for the actions, thereby learning surrounding environments and eventually choosing the best action. Based on the above-described machine learning or reinforcement learning algorithms, the present disclosure proposes effective methods for solving retransmission problems for polar codes, retransmission problems in non-orthogonal multiple access (NOMA) systems, HARQ problems, and pilot insertion problems for polar codes.

The above-described multi-armed bandit algorithm, Q-learning, and DQN are referred to as reinforcement learning algorithms Reinforcement learning is a type of machine learning, and among supervised learning and unsupervised learning, the reinforcement learning may be classified as the unsupervised learning. The main feature of reinforcement learning is that it does not require any prior knowledge or mathematical modeling for environments. In communications, many assumptions are made to attempt to solve problems in communication systems based on mathematical modeling. In this case, if even one of the assumptions is invalid, no algorithm may not work in practice. On the contrary, in reinforcement learning, no assumptions are made in advance. Instead, environments are learned based on rewards given for actions performed by an agent under the environments, and the best action is chosen according to learning results. This feature of reinforcement learning is also very useful to optimize communication systems in real environments. The present disclosure proposes methods for solving communication problems based on multi-armed bandit (MAB), Q-learning, and DQN algorithms. In addition, the present disclosure proposes methods for changing various parameters of a reinforcement learning algorithm effectively and dynamically according to change in channel environments.

The purpose of a digital communication system is to transfer data (bits) from a transmitter to a receiver without errors. Multiple techniques are currently used to achieve this purpose, and polar codes are one of the techniques. The polar codes are classified into non-systematic polar codes (reference 1) and systematic polar codes (reference 2).

REFERENCE 1

E. Arikan, "Channel polarization: A method for constructing capacity achieving codes for symmetric binary-input memoryless channels," IEEE Transaction on Information Theory, vol. 55, no. 7, pp. 3051-3073, July 2009.

REFERENCE 2

E. Arikan, "Systematic polar coding," IEEE Communication Letters, vol. 15, pp. 860-862, August 2011.

When initial transmission based on polar codes fails, retransmission is attempted. In this case, it is necessary to determine how to perform the retransmission in order to maximize transmission throughput. However, it is very difficult to solve such a problem mathematically or analytically.

The present disclosure proposes retransmission methods in the NOMA communication system. In the NOMA system, one or more users may transmit data in the same frequency band at the same time. Alternatively, one or more users may transmit data in frequency bands at the same time. The receiver decodes data by using a successive interference cancellation (SIC) decoder. Compared to other conventional systems, the NOMA system may increase the overall transmission rate from the system point of view. Even in the NOMA system, when initial transmission fails, retransmission needs to be performed. Thus, it is very important to determine which retransmission method provides the best performance among possible various methods. However, as described above, it is very difficult to solve such a problem mathematically or analytically.

The present disclosure proposes methods for efficiently transmitting a pilot signal for channel measurement. The receiver requires channel information for decoding systematic or non-systematic polar codes. One method is to separately transmit a pilot signal to measure channel information, but a more efficient method is to transmit a pilot signal as a partial polar codeword. Although such a method is effective, it needs to be determined how many pilot signals are included in a polar code for optimal performance. Further, as described above, it is difficult to solve such a problem mathematically or analytically.

The present disclosure may provide the following methods based on the MAB, Q-learning, and DQN algorithms.

When initial transmission fails in the polar code communication system, an optimal retransmission method may be determined based on the MAB algorithm.

When initial transmission fails in the NOMA communication system, an optimal retransmission method may be determined based on the MAB algorithm.

To maximize the performance of the MAB algorithm, various parameter values may be actively adjusted depending on change in the wireless channel.

Q-learning may be used to solve general HARQ problems.

Q-learning may be used to apply HARQ to the polar code communication system.

Q-learning may be used to apply HARQ to the NOMA communication system.

To maximize the performance of Q-learning, various parameter values may be actively adjusted depending on change in the radio channel.

When channel information is known to the transmitter, DQN may be used to solve general HARQ problems.

When channel information is known to the transmitter, DQN may be used to transmit an optimal pilot signal in the polar code.

When channel information is known to the transmitter, DQN may be used to apply HARQ to the polar code communication system.

When channel information is known to the transmitter, DQN may be used to apply HARQ to the NOMA communication system.

To maximize the performance of DQN, various parameter values may be actively adjusted depending on change in the radio channel.

As a way of maximizing expected gains, a MAB problem (or K-armed bandit problem) is related to how a fixed and limited set of resources are allocated between options to be computed. The characteristics of each option are known only at the time to be allocated. Thus, the MAB problem may correspond to a reinforcement learning problem that exemplifies the exploration-exploitation tradeoff dilemma.

For example, when a gambler intends to play casino slot machines (one-armed bandits), the gambler needs to decide which machines to play, how many times to play on each machine, in which order to play the machines, etc. The MAB algorithm may relate to statistical scheduling.

Reinforcement learning is a type of machine learning, specifically, may be classified as unsupervised learning.

FIG. 7 is a diagram for explaining reinforcement learning.

In reinforcement learning, learning is performed through interaction with an environment similarly to machine learning. The subject of learning is commonly referred to as an agent. The agent obtains information (e.g., state) about the environment and determines an action. New information and rewards may be obtained from the environment changed by the determined action.

FIG. 8 is a diagram for explaining a backpropagation method in a neural network.

To update the weights of a neural network, backpropagation may be performed.

In a backpropagation model, the error function is defined by E=L(y, t), and the weight is applied to an output $o_k$ to obtain an input (input, $net_j$) of the neural network.

If a neuron is in the first layer after the input layer, $o_k$ of the input layer may simply be an input to the network, $x_k$.

Referring to FIG. 8, $o_j$ may be defined as shown in Equation 5.

$$o_j = \varphi(net_j) = \varphi\left(\sum_{k=1}^{n} w_{kj} o_k\right) \quad \text{[Equation 5]}$$

Referring to FIG. 8, the error function E may satisfy Equation 6.

$$\bullet \frac{\partial E}{\partial w_{ij}} = \frac{\partial E}{\partial o_j}\frac{\partial o_j}{\partial w_{ij}} = \frac{\partial E}{\partial o_j}\frac{\partial o_j}{\partial net_j}\frac{\partial net_j}{\partial w_{ij}} \quad \text{[Equation 6]}$$

-continued $$\checkmark \frac{\partial net_j}{\partial w_{ij}} = \frac{\partial}{\partial w_{ij}}\left(\sum_{k=1}^{n} w_{kj}o_k\right) = \frac{\partial}{\partial w_{ij}}(w_{ij}o_i) = o_i$$

$$\checkmark \frac{\partial o_j}{\partial net_j} = \frac{\partial \varphi(net_j)}{\partial net_j}$$

$$\checkmark \frac{\partial E}{\partial o_j} : E \text{ as a function with the inputs being all neurons,}$$

$L = \{u, v, w, ...\}$ receiving from input neurons $j$

– If $o_j$ is an output neuron, $\frac{\partial E}{\partial o_j} = \frac{\partial E}{\partial y} = \frac{\partial L(y, t)}{\partial y}$ $$-\frac{\partial E}{\partial o_j} = \sum_{l \in L}\left(\frac{\partial E}{\partial net_l}\frac{\partial net_l}{\partial o_j}\right) = \sum_{l \in L}\left(\frac{\partial E}{\partial o_l}\frac{\partial o_l}{\partial net_l}\frac{\partial net_l}{\partial o_j}\right) = \sum_{l \in L}\left(\frac{\partial E}{\partial o_l}\frac{\partial o_l}{\partial net_l}w_{jl}\right)$$

$$-\frac{\partial E}{\partial w_{ij}} = \frac{\partial E}{\partial o_j}\frac{\partial o_j}{\partial net_j}o_i = \delta_j o_i$$

FIG. 9 is a diagram for explaining a prediction method in an artificial neural network.

An artificial neural network includes an input layer composed of first input data, an output layer composed of last output data, and a hidden layer as an intermediate layer for calculating output data from input data. There are one or more hidden layers, and an artificial neural network including two or more hidden layers is called a deep neural network (DNN). The actual operation is performed at nodes in each floor, and each node may calculate based on the output values of other nodes connected by connection lines.

As shown in FIG. 9, input data do not affect each other, and nodes belonging to the same layer do not affect each other. Each layer exchanges data as input or output values only with nodes at adjacent layers, i.e., upper or lower layers.

FIG. 9 shows that all nodes in different layers are connected to each other by connection lines, but connection lines between nodes belonging to adjacent layers may be omitted if necessary. However, when there is no connection line, processing may be performed by setting a weight of 0 for a corresponding input value.

When the results of an output layer are predicted from an input layer according to the prediction direction of the artificial neural network, an input value may be predicted from the results during learning. In general, in artificial neural networks, since input and output values do not have a one-to-one correspondence, it is difficult to restore the original input layer from the output layer as it is. However, if input data calculated from the results calculated by a backpropagation algorithm in consideration of a prediction algorithm is different from first input data, the prediction of the artificial neural network may be considered to be inaccurate. Therefore, learning may be trained by changing prediction coefficients so that the input data calculated under constraints become similar to the first input data.

FIG. 10A is a diagram for explaining a method of operating a recurrent neural network.

In a recurrent neural network (RNN), when there are chronological input data x0, x1, and x2, an output value a0 may be predicted only from x0, unlike the artificial neural network of FIG. 9. In addition, an output value b0 may be calculated based thereon, and b0 may be reused to predict a1.

In the artificial neural network of FIG. 9, it is assumed that multiple input data are simultaneously input. If the input data are time series data, prediction may be allowed only after all data are input. Thus, output values may be calculated by an RNN method to process the time series data. In addition, the RNN may be applied to the Markov decision process (MDP).

The MDP provides a reasonable format for plans and actions in the face of uncertainty. The MDP may have various definitions. The definitions of the MDP may be treated equally to variants in question. For example, the MDP may include states, an initial state distribution, actions, state transition distributions, a discount factor, and a reward function.

In the MDP, an event may be processed as follows. First, the event may start at an initial state s0 from the initial state distribution. An action $a_t$ may be selected at a time t, and then a state $s_t$ may transition to a state $s_{t+1}$ based on the state transition distributions. That is, by repeatedly selecting actions $a_0$, $a_1$, $a_2$, states $s_1$, $s_2$, $s_3$, . . . may be obtained. Assuming that a discount factor $\gamma$ is the same for each step, a reward may be defined by $R(s_0)+\gamma*R(s_1)+\gamma^2*R(s_2)+\gamma^3*R(s_3)+$ . . . . Although the above example shows that the reward depends on only states, but the reward may depend on not only the states but actions. That is, the reward may be defined by $R(s_t, a_t)$.

In the artificial neural network, learning may be trained in the same way as shown in FIG. 9. When actual prediction is performed based on the trained learning, it may be efficient to use the RNN shown in FIG. 10A.

FIG. 10B is a diagram for explaining an operating method of long short-term memory (LSTM).

LSTM is a type of RNN method that predicts results based on forgetting gates instead of using weights of the RNN. For prediction of time-series input data, if data are sequentially processed and if past data is processed by the RNN method, old data may be reduced according to the weights, so that the value thereof may become zero after a certain stage. Thus, the old data may be no longer reflected, regardless of the weights.

In the LSTM, since addition is used instead of multiplication, there is an advantage that a recurrent input value does not become zero. However, since there may be a problem in which an old recurrent input value continuously affects a recently predicted value. Thus, coefficients may be adjusted based on the forgetting gates according to learning in order to control the influence of the recurrent input value on the recently predicted value.

1. Resolution of Communication Problems Through MAB

Based on the MAB algorithm, the present disclosure proposes methods for solving retransmission problems for polar codes and retransmission problems in NOMA systems. In addition, the present disclosure proposes methods of efficiently changing the parameters of the MAB algorithm according to the channel characteristics.

1.1 Retransmission in Polar Code 1.1.1 System Model and Throughput

FIG. 11 is a diagram for explaining a method for adding a CRC to a polar code and a method for encoding and decoding a polar code using multiple CRCs.

Referring to FIG. 11, the codeword of a polar code may be divided into a plurality of information blocks, and a CRC may be added to each of the plurality of information blocks and then transmitted. Since the CRC is added to each of the plurality of information blocks, retransmission may be performed for each of the plurality of information blocks.

Referring to FIG. 4, a CRC is usually added to each code block corresponding to a codeword (S205). A CRC added to each information block, which is obtained by dividing a code block, is different from the CRC of step S205 of FIG. 4 in that it is included in an internal processor for polar coding.

FIG. 12 is a diagram for explaining a retransmission method for polar codes.

Specifically, FIG. 12 shows that one codeword includes only two information blocks by simplifying the example of FIG. 11. However, the technical idea of FIG. 12 may be extended to a case where one codeword includes three or more information blocks.

Referring to FIG. 12, a receiver may decode a codeword and then perform a CRC check on each of the plurality of information blocks.

$CRC^{(1)}$ is a CRC for information block 1 (info block 1), and $CRC^{(2)}$ is a CRC for information block 2 (info block 2).

If the $CRC^{(1)}$ check fails and the $CRC^{(2)}$ check succeeds, a transmitter may retransmit only the first information block.

On the contrary, if only the $CRC^{(2)}$ check fails and the $CRC^{(1)}$ check succeeds, the transmitter may retransmit only the second information block.

Consider a case that both the $CRC^{(1)}$ check and the $CRC^{(2)}$ check fail. In this case, two retransmission methods may be considered. The first one is to transmit the two information blocks without coding. This is referred to as scheme 1 in this study. The second one is to transmit the two information blocks by performing polar coding on the two information blocks. This is referred to as scheme 2 in this study.

Table 5 below shows retransmission methods in the success or failure of transmission when there are two CRCs respectively corresponding to the two information blocks shown in FIG. 12.

TABLE 5

| Case | Erroneous blocks | Possible Retransmissions (actions) |
|---|---|---|
| 1 | O, O | No retransmission |
| 2 | X, O | {1} |
| 3 | O, X | {2} |
| 4 | X, X | {1, 2}, coded {1, 2} |

Table 5 summarizes available retransmission methods for each case of FIG. 12. In this section, a case in which retransmission is allowed only one time will be described.

When retransmission is allowed multiple times, the retransmission may be performed based on Q-learning, which will be described later.

To compare performance between different transmission schemes, throughput may be defined as a performance index as shown in Equation 7.

$$T = \frac{\text{\# of successfully decoded info bits}}{\text{delay due to retransmission}} = \frac{2^n \times \text{Rate} \times (1-P_e)}{\text{delay due to retransmission}} \quad \text{[Equation 7]}$$

In Equation 7, $P_e$=Pr (Err$_1$ or Err$_2$), where Err$_i$ denotes an event in which decoding of an ith information block fails.

When the code rate is 0.5, if scheme 1 is used, the throughput and the upper limit thereof may be given by Equation 8.

$$T_1 = \frac{2^n \times 0.5 \times (1 - P_e^{scheme1})}{2^n \times 0.5} = 1 - P_e^{scheme1} \leq 1 \quad \text{[Equation 8]}$$

If scheme 2 is used, the throughput and the upper limit thereof may be given by Equation 9.

$$T_2 = \frac{2^n \times 0.5 \times (1 - P_e^{scheme1})}{2^n} = 0.5(1 - P_e^{scheme2}) \leq 0.5 \quad \text{[Equation 9]}$$

Scheme 2 is effective when the SNR of a channel is low. This is because many errors occur in a poor channel environment. In scheme 2, since retransmission is performed after polar coding, the probability of error detection may increase. However, in this case, since the entirety of a codeword is retransmitted, delay may also increase. On the other hand, scheme 1 is effective when the SNR of a channel is high. This is because errors are less likely to occur in a good channel environment. Thus, even if retransmission is performed without polar coding, it is expected that information bits are successfully decoded by combination of retransmitted information and initially transmitted information. In scheme 1, since the number of retransmitted bits is only half of the codeword (because the code rate is 0.5), transmission delay may decrease. In summary, when the channel environment is good, scheme 1 provides higher throughput.

In addition to scheme 1 and scheme 2, the present disclosure proposes another scheme, and this scheme is referred to as proposed scheme 1 (or scheme 3). The basic idea of this scheme is to retransmit only the first information block (without polar coding) upon retransmission in consideration of the fact that if a decoding error occurs in a previous information block during SIC decoding, the decoding error occurs also in a next information block. When retransmission is performed in this way, the throughput and the upper limit thereof may be given as follows.

$$T_1^{pro} = \frac{2^n \times 0.5 \times (1 - P_e^{proposed})}{2^n \times 0.25} = 2(1 - P_e^{proposed1}) \leq 2$$

By comparing the throughput of the three schemes described above, the transmitter may select a scheme with the best performance. In this case, it may be problematic that the scheme with the best performance may vary not only depending on the statistical characteristics or channel gains of a channel but also depending on many parameters of a system. Thus, it may be very difficult to solve the problem of selecting the optimal retransmission method mathematically or analytically.

1.1.2 MAB Algorithm Review

As described above, it may be difficult to solve the retransmission problems in polar coding mathematically or analytically. However, the retransmission problems may be optimized by the MAB algorithm. In the MAB algorithm, the value of Q for each possible action may be defined, managed, and updated to select the optimal action.

Equation 10 below shows how to update the value of Q in the MAB algorithm.

$$Q_{n+1} = Q_n + \alpha(R_n - Q_n) \quad \text{[Equation 10]}$$
$$= \alpha R_n + (1 - \alpha)Q_n$$
$$= (1 - \alpha)^n Q_1 + \sum_{i=1}^{n} \alpha(1 - \alpha)^{n-1} R_i$$

In Equation 10, the value of a denotes a step size or a learning rate and has a value between 0 and 1. $R_n$ denotes a reward. Here, the value of Q denotes an estimated value of the reward $R_n$ (for example, $Q_n=(R_1+R_2+\ldots+R_{n-1})/(n-1)$). In this case, it is important to select and use the value of $\alpha$. In general, the value of $\alpha$ has the following tendency.

If the value of $\alpha$ is too large (e.g., $\alpha \approx 1$), learning is not stable.

If the value of $\alpha$ is too small (e.g., $\alpha \approx 0$), the speed of learning is too slow.

The learning rate may vary depending on learning steps. For example, the learning rate $\alpha$ may increase (may have a value close to 1) in the early stages of learning, and it may decrease (may have a value close to 0) in the later stages of the learning. For example, the learning rate $\alpha$ may decrease monotonically as the learning progresses. Meanwhile, the learning rate $\alpha$ may increase monotonically as the learning progresses.

When the value of Q is updated as described above, if action selection is required, the following greedy algorithm may be used in general.

$$a^{opt} = \begin{cases} \text{argmax}_{a \in A} Q(a), & \text{with } prob.\ 1 - \varepsilon \\ \text{a random action}, & \text{with } prob.\ \varepsilon \end{cases} \quad \text{[Equation 11]}$$

Equation 11 may be referred to as a $\varepsilon$-greedy algorithm in that for a probability of $1-\varepsilon$, an action a for maximizing the value of Q is selected based on the value of $\varepsilon$ according to the conventional greedy algorithm, and for a probability of $\varepsilon$—, a random action is taken, unlike the general greedy algorithm.

In Equation 11, A denotes a set of all possible actions. In addition, the value of $\varepsilon$ is related to exploration and exploitation and has a value between 0 and 1. In this case, it is important to select and use the value of $\varepsilon$. In general, the value of $\varepsilon$ has the following tendency.

If the value of $\varepsilon$ is too large (e.g., $\varepsilon \approx 1$), the exploration is too small.

If the value of $\varepsilon$ is too small (e.g., $\varepsilon \approx 0$), the exploitation is too small.

The exploration refers to a process of observing information about environments when there is no information. The exploitation refers to a process of applying learned results based on the observed information.

There is a trade-off between exploration and exploitation. In general, in machine learning, since exploration and exploitation need to be performed within a limited learning period, the number of times that the exploitation is performed may decrease as the number of times that the exploration is performed increases. When the number of times that the exploration is performed decreases, the number of times that the exploitation is performed may increase, but the performance of the exploitation may be degraded. In summary, the number of times that the exploration is performed may be selected to maximize the expected reward.

1.1.3 Optimal Polar Coding Retransmission Selection Based on MAB Algorithm

When the MAB algorithm is used for polar coding retransmission selection, the set of possible actions A may be given as follows.

$$A = \{\text{scheme 1, scheme 2, proposed 1}\} \quad \text{[Equation 12]}$$

According to the polar coding-based retransmission method according to the present disclosure, when one codeword includes two information blocks and transmission of the two information blocks fails, one of the following schemes may be performed: 1) transmitting information block 1 and information block 2 without applying polar coding (scheme 1); 2) transmitting information block 1 and information block 2 by applying polar coding (scheme 2); and 3) transmitting information block 1 and information block 2 by applying polar coding to information block 1 but without applying polar coding to information block 2 (scheme 3).

Therefore, the action set A may include scheme 1, scheme 2, and scheme 3 above.

In addition, the reward R may be given by Equation 13.

$$R = \frac{ACK^{(1)} \times ACK^{(2)}}{\text{delay due to retransmission}} \quad \text{[Equation 13]}$$

If the $CRC^{(i)}$ check is successful, ACK(i)=1.
If the $CRC^{(i)}$ check is unsuccessful, ACK(i)=0.

The reward is 0 when NACK occurs in any of the two information blocks. The value of the numerator is 1 when ACK occurs in the two information blocks.

Since the value of the denominator of the reward is determined by delay, scheme 1 has the shortest delay, scheme 2 has the longest delay, and scheme 3 may have a value between scheme 1 and scheme 2.

The value of Q may be updated as follows.

$$Q(a)=Q(a)+\alpha(R-Q(a))=(1-a)Q(a)+\alpha R \quad \text{[Equation 14]}$$

The value of Q may be determined by the reward value R and the previous value of Q.

1.2 NOMA Communication System

In the NOMA system, retransmission may be optimized based on the MAB algorithm.

1.2.1 System Model

FIG. 13 is a diagram for explaining a NOMA system model with two users.

FIG. 14 shows NOMA system method 1 (method 1) based on polar coding.

Referring to FIG. 14, each of Layer 1 and Layer 2 uses an independent polar code.

FIG. 15 shows NOMA system method 2 (method 2) based on polar coding.

Referring to FIG. 15, two layers use one polar code.

FIG. 16 is a diagram conceptually representing FIGS. 14 and 15.

1.2.2 NOMA System Retransmission Optimization Based on MAB Algorithm

FIG. 17 shows a retransmission method in a NOMA system using only one CRC for each layer. It is very difficult to determine which retransmission method among various possible retransmission methods through mathematical analysis. Based on the MAB algorithm, the optimal retransmission method may be determined.

When the MAB algorithm is used, a set of possible actions A may be given as follows.

$$\alpha \in A = \{(D^{(1)}), \{D^{(1)}, D^{(2)}\}, \text{coded}\{D^{(1)}\}, \text{coded}\{D^{(1)}, D^{(2)}\}\} \quad \text{[Equation 15]}$$

The value of Q may be updated as follows.

$$Q(a) = Q(a) + \alpha(R - Q(a)) = (1-\alpha)Q(a) + \alpha R \quad \text{[Equation 16]}$$

The reward function may be given as follows.

$$R = \frac{ACK^{(1)}[1] \times ACK^{(2)}[2]}{\text{delay due to retransmission}} \quad \text{[Equation 17]}$$

Simply,
If the $CRC^{(i)}$ check succeeds for user m, $ACK^{(i)}[m]=1$.
If the $CRC^{(1)}$ check fails for user m, $ACK^{(i)}[m]=0$.

It seems natural to define the reward R as described above. However, when the reward function is defined as described above, there are no rewards if user 2 successfully decodes data of the first layer $D^{(1)}$. However, if user 2 successfully decodes the data of the first layer $D^{(1)}$, the probability of successfully decoding data of the second layer data $D^{(2)}$ in the future may increase. Therefore, it may be effective to include decoding of $D^{(1)}$ in the reward function as well. For example, the reward may be defined as follows.

$$R_f = \frac{f(ACK^{(1)}[1], ACK^{(1)}[2], ACK^{(2)}[2])}{\text{delay due to retransmission}} \quad \text{[Equation 18]}$$

In Equation 18, $f(x_1, x_2, x_3)$ is an increasing function for $x_1$, $x_2$, and $x_3$. For example, the reward may be defined as follows based on linear combination.

$$R_f = \frac{\beta_1 ACK^{(1)}[1] + \beta_2 ACK^{(1)}[2] + \beta_3 ACK^{(2)}[2])}{\text{delay due to retransmission}} \quad \text{[Equation 19]}$$

In Equation 19, $\beta_1$, $\beta_2$, $\beta_3$ are positive constants.

1.3 MAB Algorithm Adaptive to Channel Environments

1.3.1 Active Change of ε

As described above, the optimal action may be determined by the greedy algorithm such as Equation 11. In this algorithm, the value of ε that determines the degree of exploration and exploration is an important parameter. In conventional reinforcement learning, many ways of changing the value of ε over time have been proposed and studied. However, no method of actively changing the value of ε depending on the characteristics of a radio channel has yet been proposed. Accordingly, the present disclosure proposes a method of actively changing the value of ε depending on channel environments.

FIG. 18 is a diagram for explaining a method of actively changing the value of depending on channel environments according to the present disclosure.

For a stable channel in which the statistical characteristics thereof (e.g., the average value of the channel, the coherence time of the channel, etc.) are constant, the value of ε may be configured to decrease as learning progresses. FIG. 18 shows such a concept, and more particularly, three cases in which the value of ε value decreases. In addition, two possible equations are shown at the bottom of FIG. 18. Since FIG. 18 is merely to show the concept, the value of ε may be reduced by other equations or rules in real environments. The important point is that the value of ε gradually decreases over time (that is, as the learning progresses).

1.3.2 Active Change of ε when Statistical Characteristics of Channel are Constant FIG. 19 is a diagram for explaining a method of actively changing the value of ε depending on channel environments (e.g., channel coherence time) according to the present disclosure.

As shown at the top of FIG. 19, when the channel coherence time is small (i.e., for a fast fading channel), the value of ε may be configured to decrease at a high rate (i.e., high decaying speed). The reason for this is that when the channel changes quickly, the algorithm experiences various channel conditions within a relatively short time, so that rapid learning is possible. Thus, the value of ε may be reduced more rapidly.

As shown at the bottom of FIG. 19, when the channel coherence time is large (i.e., for a slow-fading channel), the value of ε may be configured to decrease at a row rate (i.e., low decaying speed). The reason for this is that when the channel changes slowly, the algorithm needs a lot of time to experience various channel states, so that learning is not fast. Thus, the value of ε should be reduced more slowly.

1.3.3 Active Change of ε when Statistical Characteristics of Channel Vary

FIGS. 20 and 21 are diagrams for explaining a method of actively changing the value of depending on channel environments according to the present disclosure.

When the statistical characteristics of a channel do not change for a certain period of time, the value of ε may be reduced and maintained at the minimum value. However, when the statistical characteristics of the channel change, the transmitter may increase the value of ε again.

FIG. 20 shows a case in which the value of ε increases when a change in the channel statistical characteristics is greater than a threshold, and FIG. 21 shows a case in which the value of ε increases when the channel coherence time increases.

Referring to FIG. 20, the degree of decrease in the value of ε is similar before and after state transition. On the other hand, referring to FIG. 21, since the state of the channel coherence time changes, the degree of decrease in the value of ε also needs to change together.

1.3.4 Active Change of Learning Rate α

FIG. 22 is a diagram for explaining a method of actively changing the value of α depending on channel environments according to the present disclosure.

In the MAB algorithm, the value of Q is updated according to Equation 10 as described above. In this case, if the value of α is too large, learning is unstable, and if the value of α is too small, learning is too slow.

Referring to FIG. 22, the value of α may be changed according to the following method.

That is, the learning rate α may have a relationship with a range of channel variation as shown in Equation 20.

$$\alpha \propto \frac{1}{\text{Var}(|h|)} \quad \text{[Equation 20]}$$

When the range of the channel variation is small, the learning rate α increases to enable fast learning.

In other words, when the range of the channel variation is small, the value of α may increase because learning is generally much stable.

When the range of the channel variation is large, the learning rate α decreases to enable stable learning.

That is, when the range of the channel variation is large, the value of α needs to be reduced because learning may not be stable. In addition, when the range of the channel variation is large, learning requires more time (because many channel states need to be learned).

2. Resolution of Communication Problems Through Q-Learning

Hereinafter, a method of performing wireless communication based on Q-learning will be described.

2.1 Q-Learning for HARQ

A HARQ procedure may be optimized by Q-learning. For example, the HARQ procedure may be optimized on the assumption that channel size information $|h_k|$ is not known to the transmitter.

2.1.1 HARQ and System Model

Hereinafter, a HARQ procedure and a system model will be described. All information bits that are successively input are divided into blocks each having a size of $N_b$, and each block may be coded. Each information bit block may be encoded and converted into a codeword having a length of $N_s$. Therefore, the code rate may be given by Equation 21.

$$\text{Code Rate} = \frac{N_b}{N_s} \qquad [\text{Equation 21}]$$

For HARQ transmission, a codeword may be divided into J codeword bit sub-blocks, each of which has a length of $\{u_j\}_{j=1}^{J}$. In this case, Equation 22 may be satisfied.

$$\sum_{j=1}^{J} u_j = N_s \qquad [\text{Equation 22}]$$

If initial transmission fails, the HARQ procedure may start. For j-th transmission (i.e., (j−1)-th retransmission), $u_j$ coded bits included in a j-th subblock may be transmitted.

As an indicator of HARQ performance, throughput η may be defined as shown in Equation 23.

$$\eta = \frac{\text{avg \# of info bits successfully decoded}}{\text{average delay}} = \frac{N_b(1 - Pr(NACK_J))}{T_s\left(u_1 + \sum_{j=2}^{J} u_j P_r(NACK_{j-1})\right)} (\text{bits}/s) \qquad [\text{Equation 23}]$$

In Equation 23, $T_s$ is the length of each coded symbol (in seconds), and $NACK_j$ denotes an event in which the receiver fails in decoding in all transmissions up to the j-th transmission (including the j-th transmission).

Eventually, the HARQ optimization relates to solving the following optimization problem.

$$\{u_j^{opt}\}_{j=1}^{J} = \arg\max_{\{u_j\}_{j=1}^{J}} \eta \qquad [\text{Equation 24}]$$

FIG. 23 is a diagram for explaining optimization of a HARQ procedure and a system model.

FIG. 23 conceptually shows a HARQ system model and optimization thereof.

Referring to FIG. 23, a method of minimizing the number of retransmitted bits according to Equation 23 needs to be found, and the value of $Pr(NACK_j)$ also needs to be calculated mathematically. In the prior research related to polar coding retransmission, not only the value of $Pr(NACK_j)$ is known in many cases, but also the optimization problem is solved by assuming that the value of $Pr(NACK_j)$ is represented by a relatively simple formula, does not change over time, and has the same formula for all users. However, in actual environments, it may be difficult to obtain the value of $Pr(NACK_j)$ mathematically.

2.1.2 Approach by Q-Learning

To solve the optimization problem of the HARQ procedure, Q-learning may be used. In the Q-learning, a set of states, a set of all possible actions, and a reward may be defined as shown in the following equations.

State $S_k$:

$$S_k = (k, U_{k-1}) \qquad [\text{Equation 25}]$$

k ∈ {1, 2, . . . , J}

J: Maximum number of allowed retransmissions $U_k = \sum_{j=1}^{k} u_j$: Sum of numbers of all coded bits transmitted up to k-th transmission Set of all actions, A:

$$A = \{b_1, b_2, \ldots, b_L\} \qquad [\text{Equation 26}]$$

Reward, $R_{k+1}$ [Equation 27]

$$R_{k+1} = \frac{N_b \times ACK_k}{\sum_{j=1}^{k} u_j} = \frac{N_b \times ACK_k}{U_k}$$

If decoding succeeds due to an action $A_k$, $ACK_k = 1$.

If decoding fails due to the action $A_k$, $ACK_k = 0$.

In the above-described reward equations, the denominator of the reward represents delay due to retransmission (in the case of MAB), but the denominator of Equation 26 represents the total transmitted coded bits (in the case of Q-learning). In general, the number of coded bits transmitted during the k-th transmission (or (k−1)-th retransmission) may be used instead of delay.

The overall Q-learning algorithm may be given as follows.

(1) For the k-th transmission, the state $S_k = (k, U_{k-1})$ is reached.

(2) The action $A_k$ is selected (for example, the ε-greedy policy is used).

$$A_k = \begin{cases} \arg\max_{a \in A} Q(S_k, a), & \text{with } prob.\ 1 - \varepsilon \\ \text{a random action}, & \text{with } prob.\ \varepsilon \end{cases} \qquad [\text{Equation 28}]$$

(3) The action $A_k$ is taken, the reward $R_{k+1}$ is observed, and then a next state $S_{k+1}$ is obtained.

Reward $R_{k+1}$ $$R_{k+1} = \frac{N_b \times ACK_k}{\sum_{j=1}^{k} u_j} = \frac{N_b \times ACK_k}{U_k} \quad \text{[Equation 29]}$$

Next state $S_{k+1} = (k+1, U_k)$
(4) The value of Q, $Q(S_k, A_k)$ is updated as follows.

$$Q(S_k, A_k) \leftarrow \quad \text{[Equation 30]}$$
$$Q(S_k, A_k) + \alpha \left( R_{k+1} + \gamma \max_a Q(S_{k+1}, a) - Q(S_k, A_k) \right)$$

(5) The next state $S_{k+1} = (k+1, U_k)$ is reached.
(6) An action $A_{k+1}$ is selected in the next state.

$$A_{k+1} = \begin{cases} \arg\max_{a \in A} Q(S_k, a), & \text{with } prob.\ 1 - \varepsilon \\ \text{a random action,} & \text{with } prob.\ \varepsilon \end{cases} \quad \text{[Equation 31]}$$

(7) The above processes are repeated.

2.2 Q-Learning for Polar Code HARQ

In this section, a case in which retransmission problems are combined with HARQ will be discussed on the assumption that the polar codes described in section 1.1 are used. It is assumed that only two information blocks exist in a codeword as shown in FIG. 12.

In this case, a set of all actions A may be given by Equation 32.

$$A_{all} = \{a_1, a_2, a_3, a_4\} \quad \text{[Equation 32]}$$

$a_1$: Retransmission of {1}
$a_2$: Retransmission of {2}
$a_3$: Retransmission of {1,2}
$a_4$: Retransmission of coded {1,2}

A state may be defined as shown in Equation 33.

$$S_k = (k, Case_k, N_k(a_1), N_k(a_2), N_k(a_3), N_k(a_4)) \quad \text{[Equation 33]}$$

Where, $k \in \{1, 2, \ldots, J\}$
$Case_k \in \{2, 3, 4\}$; Case corresponding to time when k-th transmission is performed
$N_k(a_i)$, $i=1, 2, 3, 4$: Number of times that action $\alpha_i$ is selected and performed immediately before k-th transmission The set of all possible actions A that may be taken in the state $S_k$ may be defined by Equation 34.

$$A_k = \begin{cases} \{a_1\}, & \text{if } Case_k = 2 \\ \{a_2\}, & \text{if } Case_k = 3 \\ \{a_1, a_3, a_4\}, & \text{if } Case_k = 4 \end{cases} \quad \text{[Equation 34]}$$

A reward $R_{k+1}$ may be defined by Equation 35.

$$R_{k+1} = \frac{N_b \times ACK_k^{(1)} \times ACK_k^{(2)}}{\sum_{j=1}^{k} u_j} = \frac{N_b \times ACK_k^{(1)} \times ACK_k^{(2)}}{U_k} \quad \text{[Equation 35]}$$

If the $CRC^{(i)}$ check succeeds by taking the action $A_k$, $ACK_k^{(i)} = 1$.

If the $CRC^{(i)}$ check fails by taking the action $A_k$, $ACK_k^{(i)} = 0$.

The overall Q-learning algorithm may be given as follows.

(1) The state $S_k$ is reached.
(2) The action $A_k$ is selected from the set $A_k$ according to Equation 36.

$$A_k = \begin{cases} \arg\max_{a \in A} Q(S_k, a), & \text{with } prob.\ 1 - \varepsilon \\ \text{a random action,} & \text{with } prob.\ \varepsilon \end{cases} \quad \text{[Equation 36]}$$

(3) The action $A_k$ is taken, the reward $R_{k+1}$ is observed, and then a next state $S_{k+1}$ is obtained.
(4) The value of Q, $Q(S_k, A_k)$ is updated as follows.

$$Q(S_k, A_k) \leftarrow \quad \text{[Equation 37]}$$
$$Q(S_k, A_k) + \alpha \left( R_{k+1} + \gamma \max_a Q(S_{k+1}, a) - Q(S_k, A_k) \right)$$

(5) The next state $S_{k+1}$ is reached.
(6) An action $A_{k+1}$ is selected as follows.

$$A_{k+1} = \begin{cases} \arg\max_{a \in A} Q(S_k, a), & \text{with } prob.\ 1 - \varepsilon \\ \text{a random action,} & \text{with } prob.\ \varepsilon \end{cases} \quad \text{[Equation 38]}$$

(7) The above processes are repeated.

FIG. 24 shows a case in which one codeword includes four information blocks.

Referring to FIG. 24, a CRC may be added to each of the four information blocks, and polar coding-based retransmission may be performed as shown in Table 6 below.

TABLE 6

| Case | Erroneous blocks | Possible Retransmissions (actions) |
| --- | --- | --- |
| 1 | O, O, O, O | No retransmission |
| 2 | X, O, O, O | {1} |
| 3 | O, X, O, O | {2} |
| 4 | O, O, X, O | {3} |
| 5 | O, O, O, X | {4} |
| 6 | X, X, O, O | {1}, {1, 2}, their coded versions |
| 7 | X, O, X, O | {1}, {1, 3}, their coded versions |
| 8 | X, O, O, X | {1}, {1, 4}, their coded versions |
| 9 | O, X, X, O | {2}, {2, 3}, their coded versions |
| 10 | O, X, O, X | {2}, {2, 4}, their coded versions |
| 11 | O, O, X, X | {3}, {3, 4}, their coded versions |
| 12 | X, X, X, O | {1}, {1, 2}, {1, 2, 3}, {1, 3} their coded versions |
| 13 | X, X, O, X | {1}, {1, 2}, {1, 2, 4}, {1, 4} their coded versions |
| 14 | X, O, X, X | {1}, {1, 3}, {2, 3, 4}, {2, 4} their coded versions |
| 15 | O, X, X, X | {2}, {2, 3}, {2, 3, 4}, {2, 4} their coded versions |
| 16 | X, X, X, X | {1}, {1, 2}, {1, 2, 3}, {1, 3}, {1, 3, 4}, {1, 2, 4}, {1, 2, 3, 4}, their coded versions |

Table 6 shows retransmission methods depending on the success or failure of transmission of each information block when there are 4 CRCs respectively corresponding to the four information blocks.

Q-learning may be used based on FIG. 24 and Table 6. Further, based on Table 6, states, a set of actions, and rewards may be defined as follows.

State $S_k$:

$$S_k = (k, Case_k, N_k(a_1), N_k(a_2), \ldots, N_k(a_{|A_{all}|})) \quad \text{[Equation 39]}$$

$k \in \{1, 2, \ldots, J\}$ $\text{Case}_k \in \{6, 7, 8, \ldots, 16\}$; Case that agent encounters when k-th transmission is performed $N_k(a_i)$, $i=1, 2, \ldots, |A_{all}|$: Number of times that action $a_i$ is selected and performed immediately before k-th transmission Set of actions $A_k$:

$A_k = \{\text{possible retransmission in Case}_k\}$ [Equation 40]

Reward, $R_{k+1}$: [Equation 41]

$$R_{k+1} = \frac{N_b \times \prod_{i=1}^{4} ACK_k^{(i)}}{\sum_{j=1}^{k} u_j} = \frac{N_b \times \prod_{i=1}^{4} ACK_k^{(i)}}{U_k}$$

If the $CRC^{(i)}$ check succeeds by taking the action $A_k$, $ACK_k^{(i)} = 1$.

If the $CRC^{(i)}$ check fails by taking the action $A_k$, $ACK_k^{(i)} = 0$.

2.3 Q-Learning for NOMA HARQ

FIG. 25 is a diagram for explaining a retransmission method in a NOMA system using one CRC in one layer.

The coded bits of FIG. 25 may correspond to parity bits used in polar codes. In non-systematic polar coding, information bits are equal to input bits of the polar coding, but related output bits of the polar coding may be different from the information bits. On the other hand, in systematic polar coding, output bits related to information bits may be equal to input bits. FIG. 25 is a conceptual block diagram applicable to both non-systematic polar coding and systematic polar coding according to the characteristics of polar coding.

The retransmission method may vary depending on the CRC check at each layer. Table 7 below shows various retransmission methods.

TABLE 7

| Case | Rx 1 | Rx 2 | Possible actions |
|------|------|------|------------------|
| 1 | $CRC^{(1)}$ pass | $CRC^{(2)}$ pass | No retransmission |
| 2 | $CRC^{(1)}$ pass | $CRC^{(1)}$ pass $CRC^{(2)}$ fail | $\{D^{(2)}\}$, or its coded version |
| 3 | $CRC^{(1)}$ pass | $CRC^{(1)}$ fail $CRC^{(2)}$ fail | $\{D^{(1)}\}$, $\{D^{(1)}, D^{(2)}\}$, or its coded version |
| 4 | $CRC^{(1)}$ fail | $CRC^{(1)}$ pass $CRC^{(2)}$ fail | $\{D^{(1)}\}$, $\{D^{(1)}, D^{(2)}\}$, or its coded version |
| 5 | $CRC^{(1)}$ fail | $CRC^{(1)}$ fail $CRC^{(2)}$ fail | $\{D^{(1)}\}$, $\{D^{(1)}, D^{(2)}\}$, or its coded version |

In the NOMA system, Rx 1 may need to decode only Layer 1, but Rx 2 may need to decode both Layer 1 and Layer 2. If both the $CRC^{(1)}$ check and $CRC^{(2)}$ check are successful, no decoding is required.

On the other hand, even if Rx 1 succeed in the $CRC^{(1)}$ check, Rx 2 may fail in the $CRC^{(1)}$ check. Due to the characteristic of SIC, it is expected that Rx 2 will fail in the $CRC^{(2)}$ check upon failure of the $CRC^{(1)}$ check.

Therefore, for a NOMA system in which two UEs exist, there may be five cases as shown in Table 7.

In case 1, there is no retransmission. In case 2, only Rx 2 may retransmit $D^{(2)}$ or the coded version of $D^{(2)}$.

In cases 3 and 5, since the $CRC^{(1)}$ check fails, only $D^{(1)}$ or $\{D^{(1)}, D^{(2)}\}$ may be retransmitted due to the characteristics of SIC.

In case 4, since Rx 2 succeeds in checking $D^{(1)}$ but Rx 1 fails in checking $D^{(2)}$, $D^{(1)}$ or $\{D^{(1)}, D^{(2)}\}$ may be retransmitted as in cases 3 and 5.

Meanwhile, when only $D^{(1)}$ is retransmitted, previously received $D^{(2)}$ may be used again for decoding according to the incremental redundancy method.

When HARQ is applied to the above-described NOMA system, performance may be improved by Q-learning. When the Q-learning is applied to retransmission in the NOMA system where one CRC exists in one layer as shown in FIG. 25, a state, a set of actions, and a reward may be defined as shown in the following equations.

State $S_k$:

$S_k = (k, \text{Case}_k, N_k(a_1), N_k(a_2), \ldots, N_k(a_6))$ [Equation 42]

$k \in \{1, 2, \ldots, J\}$ $\text{Case}_k \in \{6, 7, 8, \ldots, 16\}$; Case that agent encounters when k-th transmission is performed $N_k(a_i)$, $i=1, 2, \ldots, 6$: Number of times that action $a_i$ is selected and performed immediately before k-th transmission Set of actions $A_k$:

$A_k = \{\text{possible retransmission in Case}_k\}$ [Equation 43]

Reward, $R_{k+1}$: [Equation 44]

$$R_{k+1} = \frac{ACK_k^{(1)}[1] \times ACK_k^{(2)}[2]}{\text{delay up to and including action } A_k}$$

If the $CRC^{(i)}$ check succeeds by tacking the action $A_k$ for user m, $ACK_k^{(i)}[m] = 1$.

If the $CRC^{(i)}$ check fails by tacking the action $A_k$ for user m, $ACK_k^{(i)}[m] = 0$.

FIG. 26 is a diagram for explaining a retransmission method in a NOMA system using a plurality of CRCs in one layer.

The retransmission method may vary depending on CRC checks at each layer. The following table shows various retransmission methods in the NOMA system using a plurality of CRCs in one layer.

TABLE 8

| Case | Rx 1 | Rx 2 | Possible actions |
|------|------|------|------------------|
| 1 | $CRC^{(1,1)}$ pass $CRC^{(1,2)}$ pass | $CRC^{(2,1)}$ pass $CRC^{(2,1)}$ pass | No retransmission |

TABLE 8-continued

| 2 | CRC$^{(1,1)}$ pass CRC$^{(2,1)}$ pass {D$^{(2,2)}$}, or its coded version |
| | CRC$^{(1,2)}$ pass CRC$^{(2,1)}$ fail |
| ... | ... ... ... |
| M | CRC$^{(1,1)}$ fail CRC$^{(1,1)}$ fail {D$^{(1,1)}$}, { D$^{(1,1)}$, D$^{(1,2)}$, {D$^{(1,1)}$, D$^{(1,2)}$} |
| | CRC$^{(1,2)}$ fail CRC$^{(1,2)}$ fail D$^{(2,1)}$} |
| | CRC$^{(2,1)}$ fail {D$^{(1,1)}$, D$^{(1,2)}$, D$^{(2,1)}$, D$^{(2,2)}$}, |
| | CRC$^{(2,1)}$ fail or its coded version |

To apply Q-learning to the retransmission method of FIG. 26, a state, a set of actions, and a reward may be defined as shown in the following equations.

State $S_k$:

$$S_k=(k, \text{Case}_k, N_k(a_1), N_k(a_2), \ldots, N_k(a_{|A_{all}|}))  \quad \text{[Equation 45]}$$

$k \in \{1, 2, \ldots, J\}$

Case$_k \in \{2, 3, 4, \ldots, M\}$; Case that agent encounters when k-th transmission is performed $N_k(a_i)$, i=1, 2, ..., $|A_{all}|$: Number of times that action $a_i$ is selected and performed immediately before k-th transmission Set of actions $A_k$:

$$A_k=\{\text{possible retransmission in Case}_k\} \quad \text{[Equation 46]}$$

Reward, $R_{k+1}$: [Equation 47]

$$R_{k+1} = \frac{ACK_k^{(1,1)}[1] \times ACK_k^{(1,2)}[2] \times ACK_k^{(2,1)}[2] \times ACK_k^{(2,2)}[2]}{\text{delay up to and including action } A_k}$$

If the CRC$^{(i)}$ check succeeds by tacking the action $A_k$ for user m, ACK$_k^{(i)}$[m]=1.

If the CRC$^{(i)}$ check fails by tacking the action $A_k$ for user m, ACK$_k^{(i)}$[m]=0.

2.4 Q-learning Adaptive to Channel Environments 2.4.1 Active change of ε

In Q-learning, retransmission performance may be improved by actively changing the value of ε depending on channel environments as described above in sections 1.3.1, 1.3.2, and 1.3.3.

2.4.2 Active Control of Learning Rate α

In Q-learning, retransmission performance may be improved by actively changing the value of α depending on channel environments as described above in section 1.3.4.

3. Resolution of Communication Problems Through DQN

Several communication problems in HARQ retransmission based on polar coding and retransmission in NOMA may be solved by DQN. The reasons for using DQN instead of Q-learning are as follows. In Q-learning, the condition that the number of states needs to be finite should be satisfied. In addition, the number of states not only needs to be finite but also should not be too large to achieve satisfactory learning effects in Q-learning. However, in actual environments, the number of states may be very large or infinite. For example, it may be considered that a channel gain $|h_k|$ is included in states. Since the channel gain has a continuous value, when the channel gain is included in the states, the number of states may become infinite. When the number of states is infinite or very large, the use of DQN may provide satisfactory learning effects compared to Q-learning. It is assumed that the channel size information $|h_k|$ is known to the transmitter.

3.1 DQN for HARQ 3.1.1 DQN Design

DQN may be applied to the aforementioned HARQ procedure using Q-learning. In DQN, a state including the channel gain $|h_k|$ may be defined. To design DQN for HARQ application, a state, a set of actions, and a reward may be defined as shown in the following equations.

State $S_k$:

$$S_k=(k, U_{k-1}, |h_k|) \quad \text{[Equation 48]}$$

$k \in \{1, 2, \ldots, J\}$ $U_k = \sum_{j=1}^{k} u_j$: Sum of numbers of all coded bits transmitted up to k-th transmission Set of all actions $A$:

$$A=\{b_1, b_2, \ldots, b_L\} \quad \text{[Equation 49]}$$

Reward $R_{k+1}$ [Equation 50]

$$R_{k+1} = \frac{N_b \times ACK_k}{\sum_{j=1}^{k} u_j} = \frac{N_b \times ACK_k}{U_k}$$

If decoding succeeds due to an action $A_k$, ACK$_k$=1.

If decoding fails due to action $A_k$, ACK$_k$=0.

In DQN, the value of Q is not immediately updated, but may be indirectly updated by training an artificial neural network. Assuming that w is a parameter of the artificial neural network, the mean square error of these values may be defined as follows.

$$J(w_k) = E\left[\left(R_{k+1} + \gamma \max_a Q(S_{k+1}, a, w^-) - Q(S_k, A_k, w_k)\right)^2\right] \quad \text{[Equation 51]}$$

$w^-$: As a parameter of a target artificial neural network, this value is copied from a learning artificial neural network at a regular interval.

γ: Discount factor

E[•]: Past experience is stored in an experience replay memory. Then, the artificial neural network is trained by bring the past experience by a batch size according to a batch gradient method.

Based on the above mean square error, the parameters of the artificial neural network may be updated as follows.

$$w_{k+1} = w_k + \alpha' \nabla_{w_k} J(w_k) \quad \text{[Equation 52]}$$

In Equation 52, α' denotes the learning rate of the artificial neural network, and ∇ denotes the gradient.

In DQN, it is difficult to directly calculate the expected reward value (Q value) in the artificial neural network unlike Q-learning. Therefore, instead of directly updating the value of Q, the parameters of the neural network may be updated to maximize the expected reward value (see Equations 51 and 52).

The parameters of the artificial neural network may mean parameters corresponding to lines connecting nodes at each layer of FIG. 9. In general, the computational complexity of DQN is greater than that of Q-learning, but it has advantages in that learning results are more accurate and a large amount of training data may be processed quickly in parallel.

3.1.2 Active Control of ε

In DQN, the value of ε may be actively changed depending on channel environments to maximize performance as described above in sections 1.3.1, 1.3.2, and 1.3.3.

3.1.3 Active Control of Experience Replay Memory Size

One of the most important features of DQN is the use of an experience replay memory. Specifically, a certain amount of experience may be randomly selected from the experience replay memory to update the artificial neural network according to a batch gradient method.

According to the present disclosure, the size of the experience replay memory may be adjusted adaptively or actively depending on the channel environments.

When the statistical characteristics of a channel do not change, the size of the experience replay memory increases to achieve stable operation.

On the other hand, while the statistical characteristics of the channel change (or after the change), the size of the experience replay memory may be reduced. If the channel characteristics frequently change, old experience that is no longer needed may be deleted from the memory because the old experience is not helpful for learning.

When the channel changes slowly (when the channel coherence time is large), the size of the experience replay memory should be kept large. The reason for this is that when the channel changes slowly, the correlation between experience samples is large. That is, since the large correlation needs to be reflected in learning, the size of the replay memory needs to be kept large.

If the channel changes rapidly (when the channel coherence time is small), the size of the experience replay memory should be kept small In this way, when the statistical characteristics of the channel change, a new channel may be learned quickly.

3.1.4 Active Control of Update Period of Target Artificial Neural Network

The second most important feature of DQN is that a target artificial neural network is separated from a learning artificial neural network, and the target artificial neural network is periodically updated.

According to the present disclosure, the update cycle of the target artificial neural network may be actively adjusted depending on channel environments.

When the statistical characteristics of a channel do not change, the update cycle of the target artificial neural network may be set sufficiently large to enable stable learning.

When the statistical characteristics of the channel change (or immediately after the change), the update cycle of the target artificial neural network may be shortened to enable fast learning. This may be interpreted to mean that the target artificial neural network, which has been trained based on the characteristics of an old channel, is discarded and a new target artificial neural network is used.

When the channel changes slowly (when the channel coherence time is large), the update cycle of the target artificial neural network may be lengthened to enable stable learning.

When the channel changes rapidly (when the channel coherence time is small), the update cycle of the target artificial neural network need to be kept short. In this way, when the statistical characteristics of the channel change, a new channel may be learned quickly.

Unlike Equation 47, the state may be defined as shown in Equation 53 to improve the performance of DQN. When the state is defined as follows, channel gains when coded bits were transmitted may be included in the state, so that the transmitter may more accurately adjust its information transmission rate for each retransmission.

State $S_k$:

$$S_k = (k, (U_1, |h_1|), (U_2, |h_2|), \ldots, (U_{k-1}, |h_{k-1}|), |h_k|) \quad \text{[Equation 53]}$$

The discount factor γ may be adjusted adaptively or dynamically. The discount factor is used in Equation 50. The discount factor γ may be adjusted to reduce the impact of past data and increase the impact of current data as learning progresses. For example, when the statistical characteristics of a channel are fixed, the value of γ may decrease at the beginning of learning, but may increase as time passes. When the statistical characteristics of the channel change, new learning is required, and thus the value of γ may decrease and then gradually increase.

The learning rate α', which is used for learning of the artificial neural network, may also be adjusted. The learning rate α' is to update the parameters of the artificial neural network. For example, when the statistical characteristics of a channel are fixed, the value of α' may decrease at the beginning of learning, but may increase as time passes. On the other hand, the value of α' may increase at the beginning of learning, but may decrease as time passes. The learning rate α' may be adjusted based on the statistical characteristics of the channel. When the statistical characteristics of the channel change, new learning is required, and thus the value of α' may decrease and then gradually increase. On the other hand, when the statistical characteristics of the channel change, the value of α' may increase and then gradually decrease.

3.2 DQN for Dynamic Pilot Allocation

DQN may be applied when a pilot signal is transmitted as some of the coded bits of a polar code.

FIG. 27A is a diagram for explaining a method of combining a systematic polar code with channel measurement according to the present disclosure.

FIG. 27A is a diagram for explaining a method of increasing the efficiency of channel coding by combining channel estimation and systematic polar coding.

Referring to FIG. 27A, a length-16 polar code is generated by combining a length-12 systematic polar code with four pilot signals is described. Here, the four pilot signals may simultaneously serve two functions as follows.

1) performing channel measurement
2) increasing the actual code length to improve the reliability of transmitted information bits If the pilot signals and polar code are separately transmitted, the polar code length becomes 12, and the coding rate is 4/12=1/3. On the other hand, when the pilot signals and polar code are transmitted together, the actual code length becomes 16, and the coding rate is 8/16. However, since the log likelihood ratio (LLR) values of received symbols corresponding to the four pilot signals are infinite, the actual code rate becomes 4/16, which is less than 1/3. Consequently, the reliability of information bits may be improved.

Method of Combining Systematic Polar Code with Channel Measurement

Referring to FIG. 27A, four pilot signals are transmitted at a regular interval. If the channel varies over time, transmitting pilot signals at a regular interval may be best in terms of channel estimation. However, such pilot signal allocation may not be best from the point of view of systematic polar codes.

In the method of FIG. 27A, 4th, 8th, 12th, and 16th input signals (Rank 11, 5, 4, and 1) are converted into parity check bits (code bits) other than frozen bits. That is, 1st, 2nd, 3rd, 5th, 6th, 7th, 9th, and 10th input bits are used as frozen bits in systematic polar coding. The bit-channel capacity of the 10th input bit used as one frozen bit is 0.53274. Specifically, the 10th input bit corresponds to a bit channel with the 8th highest bit-channel capacity among the 16 input bits. The fundamental concept of polar codes is that input bits with high bit-channel capacities are used as information bits and input bits with low bit-channel capacities are used as frozen bits. That is, in the method of FIG. 27A, the locations of the frozen bits (or the locations of the information bits) may not be optimized.

FIG. 27B is a diagram for explaining a method of combining a systematic polar code with channel measurement according to the present disclosure.

Referring to FIG. 27B, a pilot signal may be transmitted as some coded bits in systematic polar coding.

Referring to FIG. 27B, the problems mentioned in FIG. 27A may be solved.

Specifically, FIG. 27B is a diagram for explaining a method of combining a systematic polar code with channel measurement based on bit-channel capacities.

First, frozen bits are transmitted on bit channels with the lowest bit-channel capacities among all input bits. However, when frozen bits are allocated as described above, pilot signals may not be arranged at a regular interval. Permutation operation may be applied to solve this problem, that is, to arrange pilot signals at a regular interval.

According to the method of FIG. 27B, since the pilot bits are known bits, the LLR values thereof may become infinite during decoding.

Method of Combining Non-systematic Polar Code with Channel Measurement

Hereinabove, how systematic polar coding is combined with channel measurement according to the present disclosure have been described with reference to FIGS. 27A and 27B. However, non-systematic polar coding may be used more frequently. Thus, how non-systematic polar coding is combined with channel measurement will be described. A method of combining non-systematic polar coding with channel measurement will be described in detail with reference to FIG. 28A.

In this document, the following notation may be used.
Bit Channel Indices
A: Index set of information bits
P: Index set of pilot signal bits
F: Index set of frozen bits
Output Bit Vector
$x=(x_P, x_{A,F})$: polar coding output bit vector (codeword)
$x_P$: This denotes a vector set of pilot signal bits in a codeword corresponding to bit indices, that is, an output bit vector in a codeword positioned at the same location as an input bit vector up. In other words, the input bit vector up is related to the output bit vector $X_P$.
$x_{A,F}$: This denotes an output bit vector in a codeword positioned at the same location of input bit vectors $u_A$ and $u_F$. That is, the output bit vector $x_{A,F}$ is related to input bit vectors $u_A$ and up.
Input Bit Vector
$u=(u_A, u_P, u_F)$: total input bit vector
$u_A$: This denotes an input bit vector related to the indices of information bits.
$u_P$: This denotes a vector of input bits positioned at the same location as pilot signals in a codeword related to the indices of pilot signal bits.
$u_F$: This denotes a frozen bit vector related to the indices of frozen bits.

Generator Matrix
G: This denotes a polar code (coding) generator matrix.
$G_{AF,P}$: This denotes a sub-matrix of G, where an (i, j)-th element $G_{i,j}$ may satisfy the following condition: $i \in A \cup F$ and $j \in P$.
$G_{P,P}$, $G_{P,AF}$, and $G_{AF,AF}$: These are defined similarly to $G_{AF,P}$.

To combine non-systematic polar coding with channel measurement, encoding needs to be performed as follow. First, it may be seen that Equation 54 below is established from the polar code generator matrix.

$$x_P = u_P G_{P,P} + (u_A, u_F) G_{AF,P}$$

$$x_{AF} = u_P G_{P,AF} + (u_A, u_F) G_{AF,AF}$$

Based on the above relation, $u_p$ is computed, and then $x_{AF}$ is computed based on the value of $u_p$.

$$u_P = (x_P - (u_A, u_F) G_{AF,P}) G_{P,P}^{-1} \quad \text{(step 1):}$$

$$x_{AF} = u_P G_{P,AF} + (u_A, u_F) G_{AF,AF} \quad \text{(step 2):}$$

Decoding of systematic polar codes is basically equal to decoding of non-systematic polar codes. However, since the receiver knows codeword symbols corresponding to pilot signals, the LLR values thereof may be set infinite.

FIG. 28A is a diagram for explaining a method of combining a non-systematic polar code with channel measurement according to the present disclosure.

Referring to FIG. 28A, uF, and uA correspond to xAF, and up corresponds to xP as described above. Here, the correspondence means that the locations of input bits (uF, uA, and uP) are related to those of output bits (xAF and xP). As shown in FIG. 28A, input bits are converted into output bits based on the polar code generator matrix. The bit values of input bits set as frozen bits may be 0, and pilot signal bits may be bit sequences used as pilot signals. That is, coded bits may be determined such that the pilot signal bits are equivalent to the bit sequences used as pilot signals.

Since the bit sequences used as pilot signals are already known, the pilot signal bits among output bits obtained from polar coding may be known bits.

FIG. 28B is a diagram for explaining a method of combining a non-systematic polar code with channel measurement where permutation is used to arrange pilot signals at a regular interval according to the present disclosure.

Referring to FIG. 28B, a pilot signal may be transmitted as some coded bits in non-systematic polar coding.

As shown in FIGS. 27A, 27B, 28A, and 28B, pilot insertion may be used for both systematic and non-systematic polar codes in polar coding.

FIG. 28 B shows a method of arranging pilot signals at a regular interval by additionally applying permutation operation to the method of FIG. 28A.

Referring to FIG. 28A, when polar coding is combined with channel measurement based on pilot signals, the locations of coded bits for generating pilot signal bits are determined by channel capacity. In addition, since the pilot signal bits are generated such that the locations thereof correspond to those of the coded bits, the distance between the locations of the pilot signal bits among polar coding output bits is determined by the channel capacity.

Referring to FIG. 28B, since it is desirable that the pilot signal bits are arranged at the same interval, the locations of the pilot signal bits may be changed by the permutation operation.

In this case, the most important question is how many pilot signals need to be included to obtain the best performance when the length of a codeword is given. If too few pilot signals are inserted, the overall decoding performance may be degraded due to channel estimation errors. On the contrary, if pilot signals are inserted more than necessary, the number of coded bits that we actually send decreases even though channel estimation becomes accurate, so that the overall performance may be degraded as well. Therefore, it is important to find the optimal number of pilot signals inserted in the polar code. However, it is very difficult to solve this problem with an analytical method based on mathematics or a dynamic programming method. This is because coding and all system parameters affect the performance In polar coding, the number of pilots to be inserted may be calculated based on DQN.

In polar coding according to the present disclosure, a state, a set of actions, and a reward may be defined as follows for DQN configured to calculate the number of inserted pilots.

State $S_k$:

$$S_k = (k, |h_k|) \quad \text{[Equation 56]}$$

Set of actions $A$:

$$A = \{1, 2, \ldots, \Omega_{pilot}^{max}\} \quad \text{[Equation 57]}$$

In Equation 57, $\Omega_{pilot}^{max}$ denotes the maximum number of pilot signals inserted into one codeword.

Reward $R_{k+1}$:

$$R_{k+1} = (n - A_k \times l_p) \times ACK_k \quad \text{[Equation 58]}$$

If decoding succeeds, $ACK_k = 1$.
If decoding fails, $ACK_k = 0$.
n: Codeword length (number of coded bits in codeword)
Length of each pilot (number of bits used for each pilot)

3.3 DQN for Polar Code HARQ

DQN may be applied to the retransmission and HARQ in polar codes described above in section 2.2 above. As shown in FIG. 12, it is assumed that there are two information blocks.

According to the present disclosure, a state and a set of all actions in DQN may be defined as follows.

Set of all possible actions $A_{all}$:

$$A_{all} = \{a_1, a_2, a_3, a_4\} \quad \text{[Equation 59]}$$

$a_1$: Retransmission of {1}
$a_2$: Retransmission of {2}
$a_3$: Retransmission of {1,2}
$a_4$: Retransmission of coded {1,2}

State $S_k$:

$$S_k = (k, Case_k, N_k(a_1), N_k(a_2) N_k(a_3) N_k(a_4), |h_k|)$$

or $$S_k = (k, Case_k, N_k(a_1), N_k(a_2) N_k(a_3) N_k(a_4), |h_{k-L}|, |h_{k-L+1}|, \ldots, |h_k|) \quad \text{[Equation 60]}$$

$k \in \{1, 2, \ldots, J\}$
$Case_k \in \{2, 3, 4\}$; Case corresponding to time when k-th transmission is performed
$N_k(a_i)$, i=1, 2, 3, 4: Number of times that action $a_i$ is selected and performed immediately before k-th transmission When there are several information blocks in a codeword as shown in FIG. 24, DQN may be applied by defining the state and the action set in order to solve the aforementioned problems.

3.4 DQN for NOMA HARQ

DQN may be applied to the above-described NOMA HARQ.

For retransmission in the NOMA system where only one CRC exists in one layer as shown in FIG. 25, a state may be defined for DQN.

State $S_k$:

$$S_k = (k, Case_k, N_k(a_1), N_k(a_2), N_k(a_3), N_k(a_4), N_k(a_5), N_k(a_6), |h_k|)$$

or $$S_k = (k, Case_k, N_k(a_1), N_k(a_2), \ldots, N_k(a_6), |h_{k-L}|, |h_{k-L+1}|, \ldots, |h_k|) \quad \text{[Equation 61]}$$

$k \in \{1, 2, \ldots, J\}$
$Case_k \in \{2, 3, 4, 5\}$; Case that agent encounters when k-th transmission is performed
$N_k(a_i)$, i=1, 2, 3, 4, 5, 6: Number of times that action $a_i$ is selected and performed immediately before k-th transmission When multiple CRCs exist in one layer as shown in FIG. 26, DQN may be applied by defining the state and the action set as described above.

FIG. 29 is a diagram for explaining a method of transmitting data based on polar coding according to the present disclosure.

The present disclosure provides a method for transmitting data based on polar coding in a wireless communication system. The method may include: transmitting data including a plurality of information blocks, wherein each of the plurality of information blocks includes a corresponding CRC; receiving a hybrid automatic repeat request acknowledgement/negative acknowledgment (HARQ ACK/NACK) for the transmitted data; learning to retransmit the plurality of information blocks; and retransmitting the plurality of information blocks based on the HARQ ACK/NACK. The learning may include: obtaining a current state $s_n$; obtaining actions to be applied to the current state $s_n$; and selecting an action for maximizing an expected reward value $Q_{n+1}$ from among the actions. The expected reward value $Q_{n+1}$ may be obtained based on rewards $R_1, R_2, \ldots, R_n$ respectively related to states $s_1, s_2, \ldots, s_n$. The plurality of information blocks may be retransmitted based on the selected action.

The learning may further include obtaining a next state $s_{n+1}$ based on the current state $s_n$ and the selected action.

The learning step may be repeatedly performed.

For example, the next state $s_2$ may be obtained by performing the learning based on the current state $s_1$, and the learning may be repeatedly performed so that the states $s_1, s_2, \ldots, s_n$ may be obtained.

A reward corresponding to the current state may be obtained based on an action selected in the current state. Considering that a plurality of actions may be applied to the current state, in actual learning, all rewards for all actions may be obtained, and then based on rewards obtained so far, a reward (and action related thereto) for maximizing the expected reward value may be selected from among all the rewards. The expected reward value may be obtained based on the rewards obtained so far and the reward related to the selected action.

The current state may include information on the number of times that transmission is performed (e.g., k-th transmission) and information on the number of bits transmitted up to now.

The expected reward value $Q_{n+1}$ may be defined by the following equation based on a latest reward $R_n$ among the rewards $R_1, R_2, \ldots, R_n$ and a previous expected reward value $Q_n$.

$$Q_{n+1}=\alpha_n R_n+(1-\alpha)Q_n$$

In the above equation, a learning rate α may be determined based on a range of channel variation.

The actions may include a first action of transmitting the plurality of information blocks without coding, a second action of coding and transmitting the plurality of information blocks, and a third action of coding and transmitting some of the plurality of information blocks and transmitting the remaining blocks without coding.

Each of the rewards related to the states may be obtained based on the cumulative number of bits of multiple information blocks transmitted up to now and the HARQ ACK/NACK. The cumulative number of bits of multiple information blocks transmitted up to now and the HARQ ACK/NACK may be obtained based on the current state and the selected action.

The expected reward value $Q_{n+1}$ may be a weighted average of the rewards based on a learning rate, and the learning rate may decrease monotonically as the learning progresses.

The expected reward value $Q_{n+1}$ may be defined by the following equation based on the rewards $R_1, R_2, \ldots, R_n$.

$$Q_{n+1} = (1-\alpha)^n Q_1 + \sum_{i=1}^{n} \alpha(1-\alpha)^{n-i} R_i$$

The expected reward value $Q_{n+1}$ may be defined by the following equation based on a latest reward $R_n$ among the rewards $R_1, R_2, \ldots, R_n$ and a previous expected reward value $Q_n$.

$$Q_{n+1}=\alpha_n R_n+(1-\alpha)Q_n$$

In the above equation, a learning rate $\alpha_n$ may decrease monotonically as n increases.

Alternatively, the learning rate $\alpha_n$ may increase monotonically as n increases.

The expected reward value may be referred to as 'Q value' in Q-learning or DQN.

For the learning in the method for processing retransmission based on polar coding, a MAB algorithm, a Q-learning algorithm, and a DQN algorithm may be used.

In addition, these algorithms may be used for retransmission in NOMA communication systems.

In NOMA, the actions may include a first action of transmitting the plurality of information blocks without coding, a second action of coding and transmitting the plurality of information blocks, a third action of coding and transmitting some of the plurality of information blocks, and a fourth action of transmitting some of the plurality of information blocks without coding.

In NOMA, a states may include information on the number of times that retransmission is performed (k), information about a situation that an agent encounters (for example, cases in Table 6 or 7), and information about the number of times that each action has been performed up to now.

The present disclosure provides an apparatus for transmitting data based on polar coding in a wireless communication system. The apparatus may include: a transceiver; a memory; and at least one processor connected to the transceiver and the memory. The memory may be configured to store instructions that, when executed, cause the at least one processor to perform operations including: transmitting data including a plurality of information blocks, wherein each of the plurality of information blocks includes a corresponding CRC; receiving a HARQ ACK/NACK for the transmitted data; learning to retransmit the plurality of information blocks; and retransmitting the plurality of information blocks based on the HARQ ACK/NACK. The learning may include: obtaining a current state $s_n$; obtaining actions to be applied to the current state $s_n$; and selecting an action for maximizing an expected reward value $Q_{n+1}$ from among the actions. The expected reward value $Q_{n+1}$ may be obtained based on rewards $R_1, R_2, \ldots$, Rn respectively corresponding to states $s_1, s_2, \ldots, s_n$. The plurality of information blocks may be retransmitted based on the selected action.

The apparatus may be mounted on an autonomous driving apparatus configured to communicate with at least one of a mobile terminal, a base station, or an autonomous driving vehicle.

The present disclosure provides a method for transmitting data based on polar coding in a wireless communication system. The method may include: transmitting data including a plurality of information blocks, wherein each of the plurality of information blocks includes a corresponding CRC; receiving a HARQ ACK/NACK for the transmitted data; and retransmitting the plurality of information blocks based on the HARQ ACK/NACK.

The method may further include learning to retransmit the plurality of information blocks.

The learning may use at least one of a MAB algorithm, a Q-learning algorithm, or a DQN algorithm.

The learning may include: obtaining a current state $s_n$; obtaining actions to be applied to the current state $s_n$; and selecting an action for maximizing an expected reward value $Q_{n+1}$ from among the actions. The expected reward value $Q_{n+1}$ may be obtained based on rewards $R_1, R_2, \ldots, R_n$ respectively related to states $s_1, s_2, \ldots, s_n$. The plurality of information blocks may be retransmitted based on the selected action.

The learning may further include obtaining a next state $s_{n+1}$ based on the current state $s_n$ and the selected action.

The present disclosure provides a method for transmitting data based on polar coding in a wireless communication system. The method may include: obtaining the number of pilot bits transmitted with a data sequence; generating encoded bits by encoding the data sequence and the pilot bits based on a polar code; and transmitting the encoded bits.

Obtaining of the number of pilot bits transmitted with the data sequence may further include learning based on at least one of a MAB algorithm, a Q-learning algorithm, or a DQN algorithm.

The learning may include: obtaining a current state $s_n$; obtaining actions to be applied to the current state $s_n$; and selecting an action for maximizing an expected reward value $Q_{n+1}$ from among the actions. The expected reward value $Q_{n+1}$ may be obtained based on rewards $R_1, R_2, \ldots, R_n$ respectively corresponding to states $s_1, s_2, \ldots, s_n$.

The learning may further include obtaining a next state $s_{n+1}$ based on the current state $s_n$ and the selected action.

FIG. 30 is a diagram for explaining a method of receiving data based on polar coding according to the present disclosure.

The present disclosure provides a method for receiving data based on polar coding in a wireless communication system. The method may include: receiving data including a plurality of information blocks, wherein each of the plurality of information blocks includes a corresponding CRC; transmitting a HARQ ACK/NACK for the received data; learning to receive again the plurality of information blocks; and receiving again the plurality of information blocks based on the HARQ ACK/NACK. The learning may include: obtaining a current state $s_n$; obtaining actions to be applied to the current state $s_n$; and selecting an action for maximizing an expected reward value $Q_{n+1}$ from among the actions. The expected reward value $Q_{n+1}$ may be obtained based on rewards $R_1, R_2, \ldots, R_n$ respectively corresponding to states $s_1, s_2, \ldots, s_n$. The plurality of information blocks may be retransmitted based on the selected action. The plurality of information blocks may be received again based on the selected action.

The present disclosure provides an apparatus for processing retransmission based on polar coding in a wireless communication system. The apparatus may include: at least one processor; and a transceiver connected to the at least one processor. The at least one processor may be configured to: receive data including a plurality of information blocks, wherein each of the plurality of information blocks includes a corresponding CRC; transmit a HARQ ACK/NACK for the received data; learn to receive again the plurality of information blocks; and receive again the plurality of information blocks based on the HARQ ACK/NACK. The learning may include: obtaining a current state $s_n$; obtaining actions to be applied to the current state $s_n$; and selecting an action for maximizing an expected reward value $Q_{n+1}$ from among the actions. The expected reward value $Q_{n+1}$ may be obtained based on rewards $R_1, R_2, \ldots, R_n$ respectively corresponding to states $s_1, s_2, \ldots, s_n$. The plurality of information blocks may be retransmitted based on the selected action. The plurality of information blocks may be received again based on the selected action.

The above-described embodiments are combinations of elements and features of the present disclosure in specific forms. The elements or features may be considered selective unless mentioned otherwise. Each element or feature may be implemented without being combined with other elements or features. Further, the embodiments of the present disclosure may be configured by combining some elements and/or some features. Operation orders described in the embodiments of the present disclosure may be rearranged. Some constructions or features of any one embodiment may be included in another embodiment or may be replaced with corresponding constructions or features of another embodiment. It is obvious that claims that are not explicitly cited in the appended claims may be presented in combination as an embodiment of the present disclosure or included as a new claim by subsequent amendment after the application is filed.

It will be appreciated by those skilled in the art that the present disclosure can be carried out in other specific ways than those set forth herein without departing from the essential characteristics of the present disclosure. The above embodiments are therefore to be construed in all aspects as illustrative and not restrictive. The scope of the disclosure should be determined by the appended claims and their legal equivalents, not by the above description, and all changes coming within the meaning and equivalency range of the appended claims are intended to be embraced therein.

INDUSTRIAL APPLICABILITY

The method and apparatus for performing channel coding based on polar codes are industrially applicable to various wireless communication systems including 3GPP LTE/LTE-A systems, 5G communication systems, etc.

The invention claimed is:

1. A method of transmitting data in a wireless communication system, the method comprising:
dividing an information sequence into a plurality of information blocks, each having a size $N_b$;
adding a corresponding cyclic redundancy check (CRC) to each of the plurality of information blocks to produce a plurality of CRC added information blocks;
applying channel coding to each of the plurality of CRC added information blocks to produce a plurality of coded information blocks;
performing a first transmission including the plurality of coded information blocks;
receiving a first hybrid automatic repeat request acknowledgement/negative acknowledgement (HARQ ACK/NACK) for the first transmission;
selecting an action from among a set A of actions based on the first HARQ ACK/NACK and machine learning, wherein the actions in the set A are respectively related to transmission schemes; and
performing a second transmission based on the selected action,
wherein the machine learning comprises:
selecting an action $A_k$ for k-th transmission at a state $S_k$,
wherein the state $S_k=(k, U_{k-1})$, where $k \in \{1, 2, \ldots, J\}$, where J is the maximum number of allowed retransmissions, and $U_{k-1}$ is the sum of numbers of all coded bits transmitted up to (k−1)-th transmission;
obtaining a reward $R_{k+1}$ and a state $S_{k+1}=(k+1, U_k)$,
wherein $R_{k+1}$ is determined based on $N_b * ACK_k/U_k$, where $ACK_k$ is 1 for decoding success for the action $A_k$, and ACK is 0 for decoding failure for the action $A_k$; and
updating an expected reward value Q based on i) an expected reward value Q for the state $S_k$ and the action $A_k$, ii) the reward $R_{k+1}$ and iii) $\alpha$, where $\alpha$ is a learning rate and is a value in a range between 0 and 1.

2. The method of claim 1, wherein the learning rate $\alpha$ is determined based on a range of channel variation.

3. The method of claim 1, wherein the actions comprises:
a first action of transmitting all the plurality of information blocks which are not coded;
a second action of transmitting all the plurality of coded information blocks; and
a third action of transmitting coded information blocks for some information blocks among the plurality of information blocks and uncoded information blocks for remaining information blocks among the plurality of information blocks.

4. An apparatus for transmitting data based on in a wireless communication system, the apparatus comprising:
a transceiver;
at least one processor; and
at least one memory storing instructions that, when executed, cause the at least one processor to perform operations comprising:
dividing an information sequence into a plurality of information blocks, each having a size $N_b$;
adding a corresponding cyclic redundancy check (CRC) to each of the plurality of information blocks to produce a plurality of CRC added information blocks;
applying channel coding to each of the plurality of CRC added information blocks to produce a plurality of coded information blocks;
performing a first transmission including the plurality of coded information blocks;

receiving a first hybrid automatic repeat request acknowledgement/negative acknowledgement (HARQ ACK/NACK) for the first transmission;

selecting an action from among a set A of actions based on the first HARQ ACK/NACK and machine learning, wherein the actions in the set A are respectively related to transmission schemes; and performing a second transmission based on the selected action, wherein the machine learning comprises:

selecting an action $A_k$ for k-th transmission at a state $S_k$, wherein the state $S_k=(k, U_{k-1})$, where $k \in \{1, 2, \ldots, J\}$, where J is the maximum number of allowed retransmissions, and $U_{k-1}$ is the sum of numbers of all coded bits transmitted up to (k−1)-th transmission;

obtaining a reward $R_{k+1}$ and a state $S_{k+1}=(k+1, U_k)$, wherein $R_{k+1}$ is determined based on $N_b*ACK/U_k$, where $ACK_k$ is 1 for decoding success for the action $A_k$, and $ACK_k$ is 0 for decoding failure for the action $A_k$; and updating an expected reward value Q based on i) an expected reward value Q for the state $S_k$ and the action $A_k$, ii) the reward $R_{k+1}$ and iii) α, where α is a learning rate and is a value in a range between 0 and 1.

5. The apparatus of claim 4, wherein the learning rate α is determined based on a range of channel variation.

6. The apparatus of claim 4, wherein the actions comprises:

a first action of transmitting all the plurality of information blocks which are not coded;

a second action of transmitting all the plurality of coded information blocks; and a third action of transmitting coded information blocks for some information blocks among the plurality of information blocks and uncoded information blocks for remaining information blocks among the plurality of information blocks.

7. The method of claim 1, wherein an action 'a' that maximizes an expected reward value Q for the state $S_k$ and the action 'a' is selected as $A_k$ with probability 1−ε, where a∈A, and $A_k$ is randomly selected from the set A with probability ε, where ε is related to a degree of exploration and exploitation and is a value in a range between 0 and 1.

8. The method of claim 7, further comprising:

decreasing ε as the machine learning progresses, based on channel coherence time of a channel being stable.

9. The method of claim 8, wherein decreasing ε as the machine learning progresses comprises:

decreasing ε at a first rate based on the channel having small channel coherence time; and decreasing ε at a second rate lower than the first rate based on the channel having large channel coherence time.

10. The method of claim 8, further comprising:

increasing ε based on the channel coherence time of the channel varying.

11. The method of claim 2, wherein the learning rate α is proportional to 1/Var(|h|), where Var(|h|) is the range of channel variation.

12. The apparatus of claim 4, wherein an action 'a' that maximizes an expected reward value Q for the state $S_k$ and the action 'a' is selected as $A_k$ with probability 1−ε, where a∈A, and $A_k$ is randomly selected from the set A with probability ε, where ε is related to a degree of exploration and exploitation and is a value in a range between 0 and 1.

13. The apparatus of claim 12, wherein the operations further comprise:

decreasing ε as the machine learning progresses, based on channel coherence time of a channel being stable.

14. The apparatus of claim 13, wherein decreasing ε as the machine learning progresses comprises:

decreasing ε at a first rate based on the channel having small channel coherence time; and decreasing ε at a second rate lower than the first rate based on the channel having large channel coherence time.

15. The apparatus of claim 13, wherein the operations further comprise:

increasing ε based on the channel coherence time of the channel varying.

16. The apparatus of claim 5, wherein the learning rate α is proportional to 1/Var(|h|), where Var(|h|) is the range of channel variation.

* * * * *